(12) United States Patent
Huang et al.

(10) Patent No.: US 9,258,888 B2
(45) Date of Patent: Feb. 9, 2016

(54) PRINTED CIRCUIT BOARD PACKAGE STRUCTURE AND MANUFACTURING METHOD THEREOF

(71) Applicant: TRIPOD TECHNOLOGY CORPORATION, TaoYuan County (TW)

(72) Inventors: Bo-Shiung Huang, New Taipei (TW); Wei-Hsiung Yang, Miaoli County (TW); Han-Ching Shih, Taoyuan County (TW); Cheng-Feng Lin, Changhua County (TW)

(73) Assignee: TRIPOD TECHNOLOGY CORPORATION, Taoyuan (TW)

( * ) Notice: Subject to any disclaimer, the term of this patent is extended or adjusted under 35 U.S.C. 154(b) by 1 day.

(21) Appl. No.: 14/205,344

(22) Filed: Mar. 11, 2014

(65) Prior Publication Data

US 2014/0266549 A1    Sep. 18, 2014

(30) Foreign Application Priority Data

Mar. 13, 2013   (TW) .............................. 102108881 A

(51) Int. Cl.

| | |
|---|---|
| *H01F 5/00* | (2006.01) |
| *H01F 27/28* | (2006.01) |
| *H05K 1/02* | (2006.01) |
| *H05K 1/16* | (2006.01) |
| *H05K 3/46* | (2006.01) |
| *H05K 3/42* | (2006.01) |
| *H01F 17/00* | (2006.01) |
| *H01F 17/06* | (2006.01) |

(52) U.S. Cl.
CPC .......... *H05K 1/0271* (2013.01); *H01F 27/2804* (2013.01); *H05K 1/165* (2013.01); *H05K 3/429* (2013.01); *H05K 3/4602* (2013.01); *H01F 17/0033* (2013.01); *H01F 17/062* (2013.01); *H05K 3/4652* (2013.01); *H05K 2201/029* (2013.01); *H05K 2201/086* (2013.01); *H05K 2201/09636* (2013.01); *H05K 2203/1178* (2013.01); *Y10T 29/49165* (2015.01)

(58) Field of Classification Search
CPC ............ H01F 5/00; H01F 27/28; H01F 30/16
USPC ......................................... 336/200, 229, 232
See application file for complete search history.

(56) References Cited

U.S. PATENT DOCUMENTS

| | | | |
|---|---|---|---|
| 5,191,699 A | * | 3/1993 | Ganslmeier ......... H01F 17/0033 264/272.19 |
| 5,925,210 A | | 7/1999 | Wagenbrenner et al. |

(Continued)

*Primary Examiner* — Tsz Chan
(74) *Attorney, Agent, or Firm* — CKC & Partners Co., Ltd.

(57) ABSTRACT

A printed circuit board package structure includes a substrate having a first surface and a second surface, a ring-shaped magnetic element, an adhesive layer, conductive portions and conductive channels. The first and second surfaces respectively have first and second metal portions. A ring-shaped concave portion is formed on a position not covered by the first metal portions of the first surface. The ring-shaped magnetic element is placed in the ring-shaped concave portion. The adhesive layer covers the first metal portions and the ring-shaped magnetic element. The conductive portions are formed on the adhesive layer. The conductive channels penetrate the conductive portions, the adhesive layer, and the substrate, and are respectively located in an inner wall and outside an outer wall of the ring-shaped concave portion. Each of the conductive channels includes a conductive film electrically connects to the aligned conductive portion and second metal portion.

18 Claims, 18 Drawing Sheets

(56) References Cited

U.S. PATENT DOCUMENTS

| | | |
|---|---|---|
| 6,148,500 A | 11/2000 | Krone et al. |
| 2005/0093133 A1 | 5/2005 | Kawasaki et al. |
| 2011/0108317 A1* | 5/2011 | Harrison ............. H01F 17/0033 174/266 |
| 2011/0291787 A1* | 12/2011 | Dalmia ................... H01F 5/003 336/200 |

* cited by examiner

PRINTED CIRCUIT BOARD PACKAGE STRUCTURE AND MANUFACTURING METHOD THEREOF

RELATED APPLICATIONS

This application claims priority to Taiwan Application Serial Number 102108881, filed Mar. 13, 2013, which is herein incorporated by reference.

BACKGROUND

1. Field of Invention

The present invention relates to a printed circuit board package structure and a manufacturing method thereof.

2. Description of Related Art

Generally, during the manufacturing processes of the circuit boards, specific elements are required to be located into a predetermined containing groove of the circuit board, such as the cooling cooper block and the cooling iron core. The iron core can be applied into the structure of the transformer or the structure of the power choke since the iron core is with magnetism. Because the magnetic elements are very sensitive to the stress, the electrical characteristics of the magnetic elements may be degraded or damaged due to the environmental stress; both the conventional manufacturing processes and package structures would lead to the stress which impacts the inductance value.

Conventional circuit boards are package structures with four layers, and the circuit boards use the Copper Clad Laminate (CCL) as the substrates, where both the front side and the back side of a CCL are covered by cooper. When making the four-layer circuit board, firstly the cooper on the front side of the substrate is patterned, and then the forming machine is used to form a containing groove at the front side of the substrate. Then all the copper on the back side of the substrate is removed by etching, and the iron core is placed into the containing groove. After that the containing groove is then filled by adhesive, and the copper foil then is laminated on both the front side and back side of the substrate. Between the copper foil and the substrate, the glass fiber (FR4) or polypropylene (PP) is used as the adhesive layer. Next, by the manufacturing processes such as drilling holes, coopering on the surface of the holes, and filling the epoxy resin, the channel (via) for conducting the cooper foil on the both front side and back side of the substrate is formed. Thereafter, the cooper foil on the both front side and back side are patterned, and, at both the front side and back side of the substrate, the epoxy resin is used to cover the patterned copper foil and the adhesive layer.

However, before laminating the copper foil on the back side of the substrate, all the cooper on the back side of the CCL is needed to be removed by etching, resulting in the waste of both the material and the cost of the process time, and the thickness of the copper foil is smaller than the copper on the back side of the substrate, thereby reducing the structure strength of the four-layer circuit board and leading to the stress which impacts the inductance value.

In addition, later when the circuit board is under the process of Surface Mount Technology (SMT), in the IR Reflow, the gas at the containing groove easily expands due to the high temperature, thereby leading to the adhesive layer and the epoxy resin covered on the substrate be damaged; unless the adhesive with high quality is used, but if designers do so, the usage of the high quality adhesive will result in the increasing cost. On the other hand, the material of the substrate is glass fiber, in the conventional process for forming the via, it is easily to be regardless that the locations of the adjacent channels may be parallel with the direction of the glass fiber of the substrate. In this way, the distance between the adjacent channels along the glass fiber is at the shortest, thereby the cracks of the adjacent channels which were formed under drilling holes on the substrate will be easily make the adjacent channels connected to each other along the glass fiber, making the copper on the surface of the adjacent channels would conduct due to the cracks and lead to the short circuit.

SUMMARY

An aspect of the present invention is a printed circuit board package structure.

According to an embodiment of the present invention, a printed circuit board package structure including a substrate, a ring-shaped magnetic element, an adhesive layer, a plurality of conductive portions, and a plurality of conductive channels is provided. The substrate includes a first surface and a second surface opposite to the first surface. The first surface and the second surface respectively have a plurality of first metal portions and a plurality of second metal portions. A ring-shaped concave portion is formed on a position that is not covered by the first metal portions of the first surface. A ring-shaped magnetic element is placed in the ring-shaped concave portion. An adhesive layer is located on the first surface, and covers the first metal portions and the ring-shaped magnetic element. A plurality of conductive portions are formed on the adhesive layer, and the conductive portions are respectively aligned with the second metal portions. The conductive channels penetrate the conductive portions, the adhesive layer and the substrate. The conductive channels are respectively located in an inner wall and outside an outer wall of the ring-shaped concave portion. Each of the conductive channels includes a conductive film electrically connects to the aligned conductive portion and second metal portion.

In an embodiment of the present invention, the substrate includes at least two gas channels. The gas channels are formed on the outer wall or the inner wall of the ring-shaped concave portion, such that the two gas channels communicates with the ring-shaped concave portion.

In an embodiment of the present invention, at least two pressure relief through holes are formed on the adhesive layer and the second protection layers on the adhesive layer. The two pressure relief through holes are respectively aligned with and communicated with the two gas channels.

In an embodiment of the present invention, the conductive channels are adjacent to the inner wall of the ring-shaped concave portion and are arranged in an approximate ring-shaped formation, and the substrate includes a plurality of longitudinal fibers and a plurality of transverse fibers. The transverse fibers are respectively perpendicular to the longitudinal fibers. Radii of the conductive channels are r, distances between centers of any two adjacent conductive channels are L, angles between lines running through centers of any two adjacent conductive channels within the inner wall of the ring-shaped concave portion and the longitudinal fibers, as well as angles between the lines running through the centers of any two adjacent conductive channels and the transverse fibers, are all greater than or equal to $\frac{1}{2}(\operatorname{Sin}^{-1}(2r/L))$.

An aspect of the present invention is to provide a manufacturing method of a printed circuit board package structure.

In an embodiment of the present invention, the manufacturing method includes the following steps: (a) providing a substrate, and pattern a first metal layer on a first surface of the substrate for forming a plurality of first metal portions; (b) forming a ring-shaped concave portion on a position that is not covered by the first metal portions of the first surface, and placing a ring-shaped magnetic element in the ring-shaped concave portion; (c) attaching an adhesive layer to the first surface, and laminating a conductive layer onto the adhesive layer; (d) drilling a plurality of through holes on the conductive layer, the adhesive layer and the substrate, and respectively forming a plurality of conductive films in the through holes for forming a plurality of conductive channels; (e) forming a plurality of first protection layers in gaps of the conductive channels; (f) patterning the conductive layer and a second metal layer on a second surface of the substrate; and (g) forming two second protection layers respectively on the adhesive layer, the conductive channels, and the patterned conductive layer, and on the patterned second metal layer, the conductive channels, and the second surface of the substrate.

In an embodiment of the present invention, the manufacturing method of the printed circuit board package structure further includes: forming at least two gas channels on an outer wall or an inner wall of the ring-shaped concave portion, such that the two gas channels communicate with the ring-shaped concave portion.

In an embodiment of the present invention, the manufacturing method of the printed circuit board package structure further includes: forming at least two pressure relief through holes on the adhesive layer and the second protection layers on the adhesive layer, and the two pressure relief through holes are respectively aligned with the two gas channels and respectively communicate with the two gas channels.

In an embodiment of the present invention, the manufacturing method of the printed circuit board package structure further includes: calculating proper angles at which the conductive channels at drilling positions of the substrate required to twist depending on the longitudinal and latitudinal layout of the glass fibers, such that the conductive films on the adjacent conductive channels do not easily conduct due to the cracks formed along the through holes.

In the aforementioned embodiments of the present invention, the printed circuit board package structure is a three-layer package structure. The second metal layer on the second surface of the substrate can be formed as a plurality of second metal portions by patterning, and through the conductive films of the conductive channels, each of the conductive portions electrically connect to a corresponding second metal portion. Compared with a conventional four-layer package structure, the second surface of the substrate does not need to etch all the second metal layer, furthermore, the second surface does not need to laminate an additional conductive layer. The patterned second metal layer (i.e., the second metal portions) is used to electrically connect to the conductive channels. Since the second metal layer is included by the substrate (Copper Clad Laminate) itself, the printed circuit board package structure of the present invention can save the time cost and the material cost of the manufacture processes that were needed at conventional processes of etching all the second metal layer and of laminating the additional conductive layer. Moreover, since the magnetic elements are very sensitive to the stress, the electrical characteristics of the magnetic elements may be degraded or damaged due to the stress causing by the manufacture processes and by the package structure itself. The three-layer package structure allow the thickness of the second metal layer being greater than the thickness of a conventional conductive layer laminated on the second surface, thus enhancing the support strength of the printed circuit board package structure, and reducing the stress which impacts the inductance value.

The printed circuit board package structure can release the pressure and remove the heat through the gas channels at the outer wall or the inner wall of the ring-shaped concave portion, and through the pressure relief through holes at the adhesive layer and the second protection layer on the adhesive layer, thereby saving the cost by omitting the adhesive material within the ring-shaped concave portion, and reducing the stress causing by the manufacture processes and by the package structure itself to improve the inductance value. Moreover, the printed circuit board package structure can avoid the gas in the ring-shaped concave portion during the IR reflow to expand due to the high temperature, such that the adhesive layer which covers the substrate and the second protection layer on the adhesive layer are not damaged.

By twisting a proper angle at which the conductive channels at the drilling positions of the substrate depending on the longitudinal and latitudinal layout of the glass fibers, the conductive films on the adjacent conductive channels do not easily conduct due to the cracks formed along the through holes, such that the short circuiting may be prevented.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
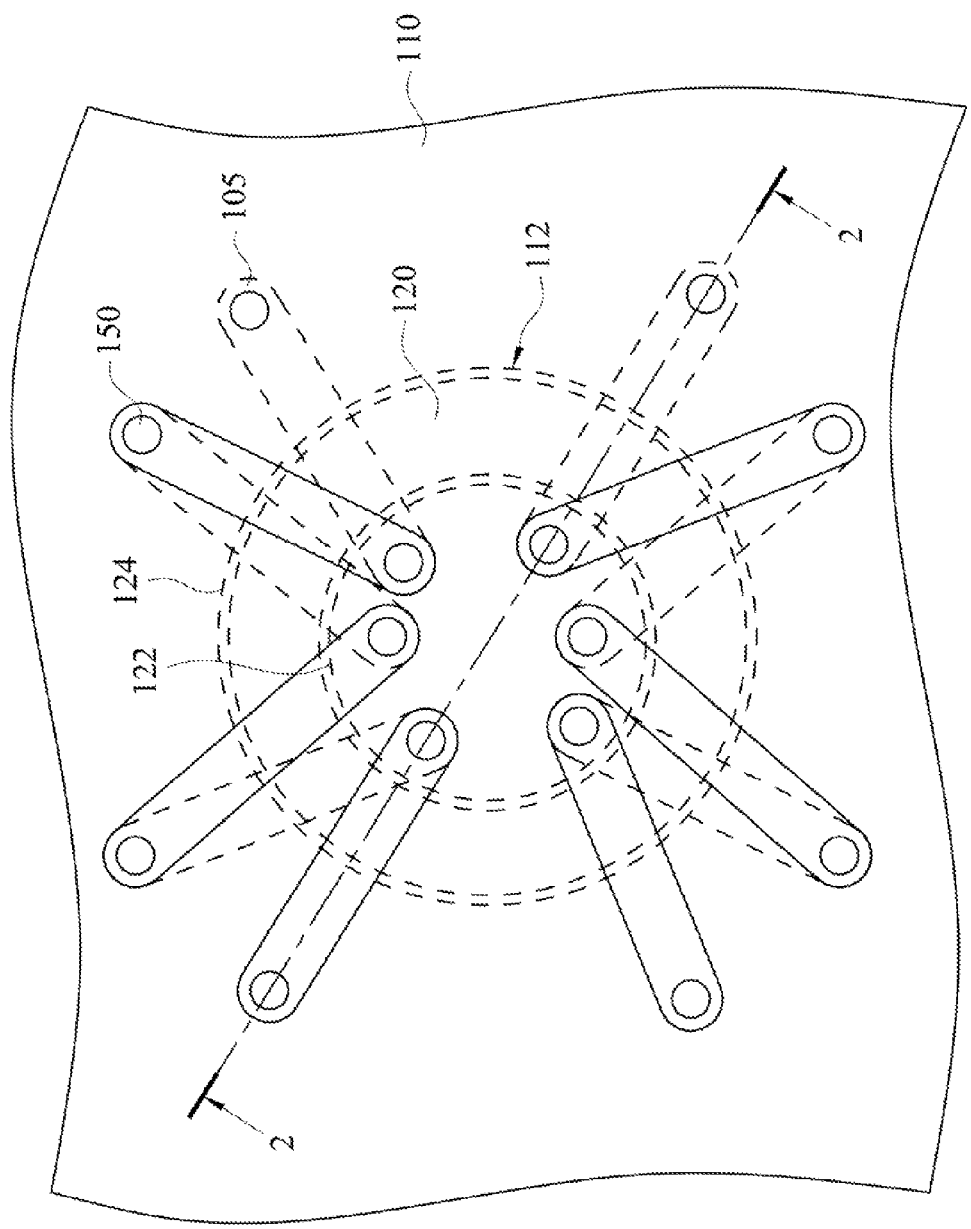
FIG. 1A is a top view of a printed circuit board package structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
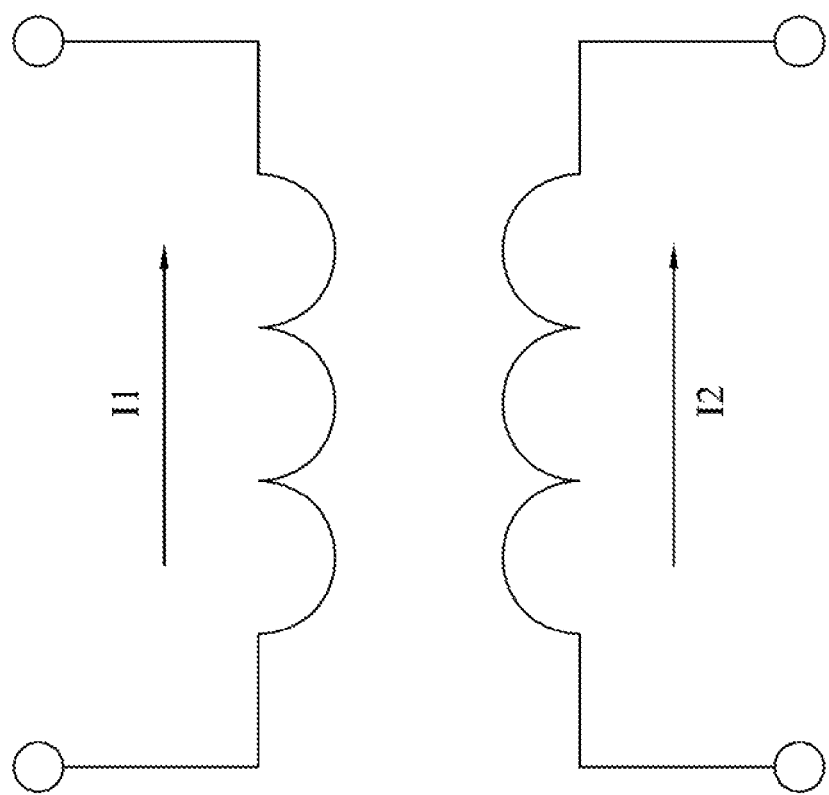
FIG. 1B is a schematic view of an equivalent circuit of FIG. 1A.

FIG. 1A is a diagram illustrating a top view of a printed circuit board package structure 100a according to an embodiment of the present invention. FIG. 1B is a schematic view of an equivalent circuit of FIG. 1A. As shown in FIG. 1A and FIG. 1B, the printed circuit board package structure 100a includes a plurality of conductive channels 150 and a plurality of circuits 105. The arrangement of the circuits 105 can be designed according to the requirements of the designer. Among the circuits 105 in FIG. 1A, the ones shown in solid lines are referred to as top layer circuits, and the ones shown in dotted lines are referred to as the bottom layer circuits, vice versa. In this embodiment, the printed circuit board package structure 100a is a power choke, which allows the electric current I1 and the electric current I2 to pass through. In the following descriptions, the connecting structure of the circuits 105 of the printed circuit board package structure 100a is described.

Figure 2:
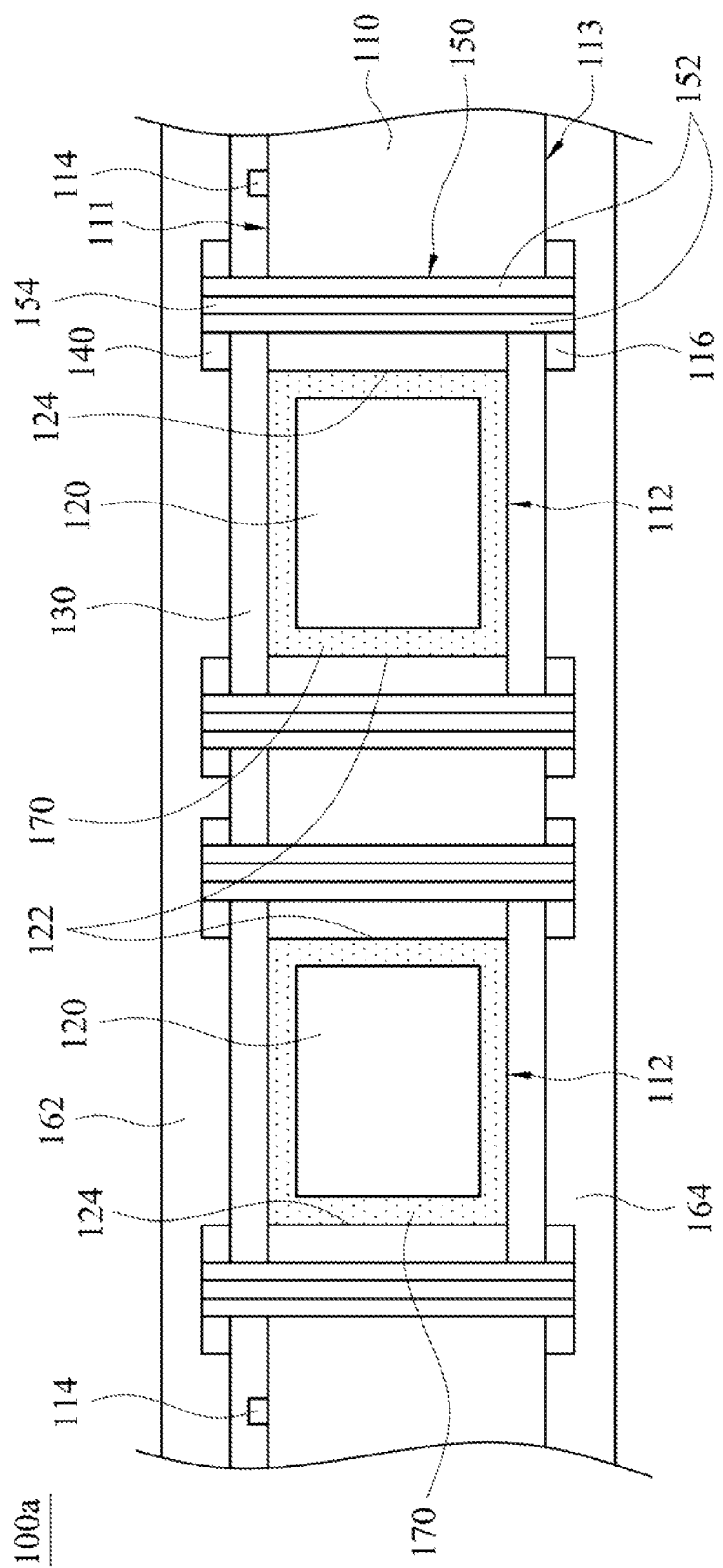
FIG. 2 is a cross-sectional view taken along line 2-2 of FIG. 1A.

FIG. 2 is a cross-sectional view taken along line 2-2 of FIG. 1A. As shown in FIG. 1A and FIG. 2. The printed circuit board package structure 100a includes a substrate 110, a ring-shaped magnetic element 120, an adhesive layer 130, a plurality of conductive portions 140, and a plurality of conductive channels 150. The substrate 110 includes a first surface 111 and a second surface 113 opposite to the first surface 111, and the first surface 111 includes a plurality of first metal portions 114 for alignment, the second surface 113 includes a plurality of second metal portions 116. The ring-shaped concave portion 112 is formed on a position not covered by the first metal portions 114 of the first surface 111, and the ring-shaped magnetic element 120 is located in the ring-shaped concave portion 112. The adhesive layer 130 is located on the first surface 111, and covers the first metal portions 114 and the ring-shaped magnetic element 120.

In addition, the conductive portions 140 are formed on the adhesive layer 130, and the conductive portions 140 are respectively aligned with the second metal portions 116. The conductive channels 150 penetrate the conductive portions 140, the adhesive layer 130 and the substrate 110, and are respectively adjacent to the inner wall 122 and the outer wall 124 of the ring-shaped concave portion 112. Each of the conductive channels 150 includes a conductive film 152, which can electrically connect to the aligned conductive portion 140 and second metal portion 116.

The printed circuit board package structure 100a may further include a plurality of first protection layers 154 and two second protection layers 162, 164. The first protection layers 154 are respectively formed in the gaps of the conductive channels 150. The gap is referred to as a space surrounded by the conductive film 152. The second protection layer 162 is formed on the adhesive layer 130, the conductive channels 150, and the conductive portions 140. The second protection layer 164 is formed on the second metal portions 116, the conductive channels 150, and the second surface 113 of the substrate 110. In the embodiment, the printed circuit board package structure 100a may further include an adhesive material 170. The adhesive material 170 is located within the ring-shaped concave portion 112 for fixing the ring-shaped magnetic element 120.

Moreover, in practical applications, the circuits 105 in FIG. 1A may be formed on inner layers of the second protection layers 162, 164, and the circuits 105 selectively electrically connect to two of the conductive portions 140 adjacent to the inner wall 122 and the outer wall 124 of the ring-shaped concave portion 112, or electrically connect to two of the second metal portions 116 adjacent to the inner wall 122 and the outer wall 124 of the ring-shaped concave portion 112, such that the circuits 105 on the second protection layers 162, 164 can be conduct through the conductive channels 150, thus achieve the effect of winding wires on the ring-shaped magnetic element 120.

In this embodiment, the substrate 110 may be a copper clad laminate (CCL) including glass fibers (FR4). The material of the first metal portions 114, the conductive portions 140, the second metal portions 116, and the conductive films 152 may include copper. The material of the adhesive layer 130 may include glass fibers (FR4) or polypropylene (PP). The material of the first protection layers 154 and the two second protection layers 162, 164 may include epoxy resin. However, the aforementioned materials are not limitations of the present invention, and the materials may be changed according to the designer's requirement.

In the following descriptions, the manufacturing processes of the printed circuit board package structure 100a will be disclosed.

Figure 3A:
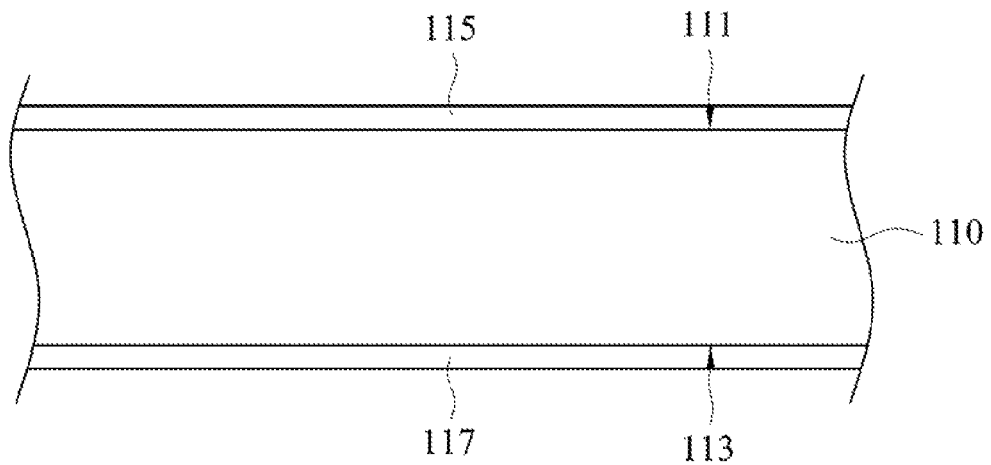
FIG. 3A to FIG. 4D are cross-sectional views of the printed circuit board package structure shown in FIG. 2 when being manufactured.
Figure 3B:
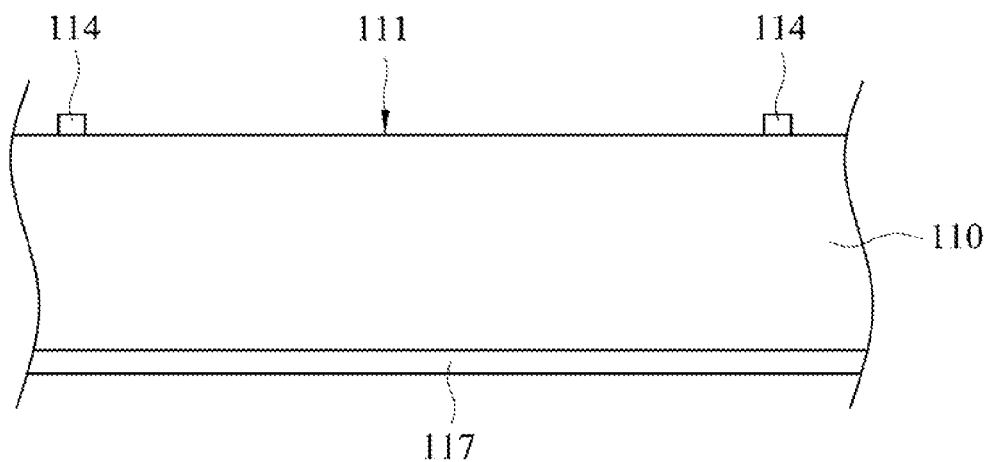
Figure 3C:
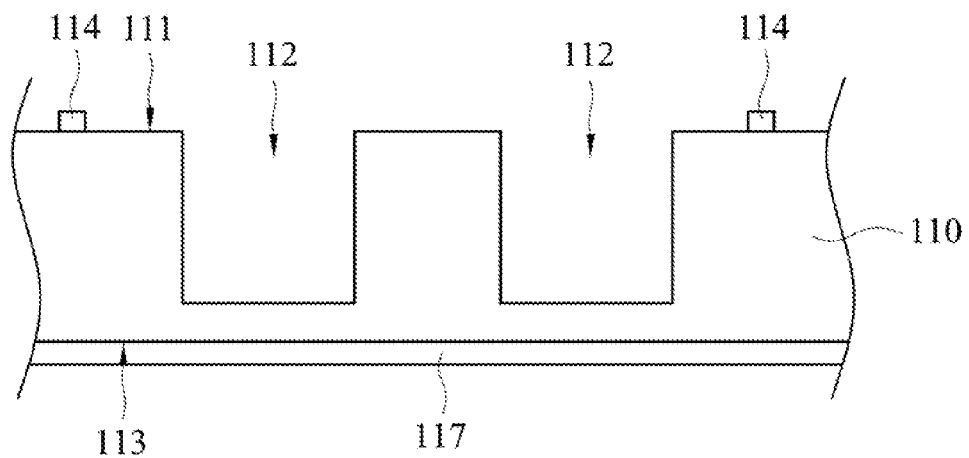
Figure 3D:
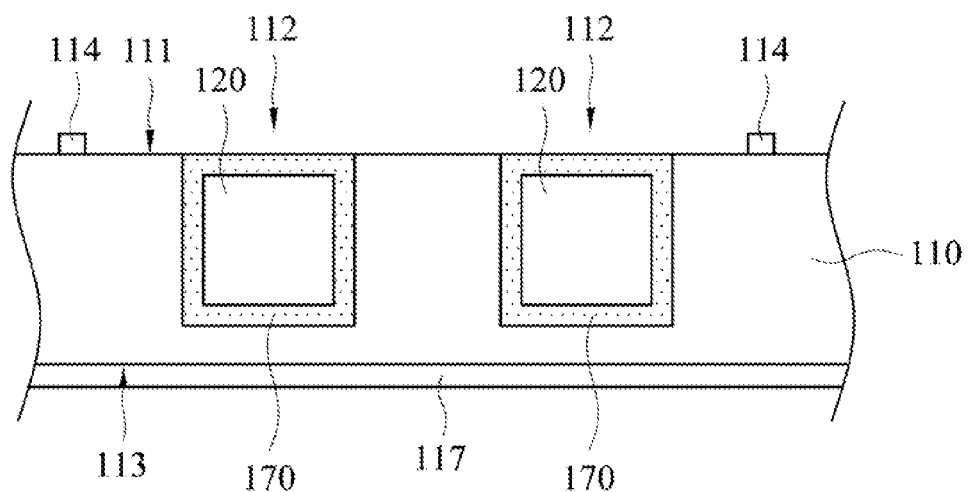

FIG. 3A to FIG. 4D are cross-sectional views of the printed circuit board package structure 100a shown in FIG. 2 when being manufactured. In FIG. 3A, the first and second surfaces 111, 113 of the CCL substrate 110 respectively have a first metal layer 115 and a second metal layer 117. Then the first metal layer 115 is patterned to form the first metal portions 114 shown in FIG. 3B, and the first metal portions 114 are used for alignment. Patterning may include, but is not limited to steps as exposure, developing, or etching. Then a route bit of a forming machine may used to form a ring-shaped concave portion 112 shown in FIG. 3C on the first surface 111. Please refer to FIG. 3D, the ring-shaped magnetic element 120 is placed into the ring-shaped concave portion 112, and the adhesive material 170 is used to fill the ring-shaped concave portion 112. In FIG. 4A, the adhesive layer 130 is attached on the first surface 111, and the conductive layer 141 is laminated on the adhesive layer 130. Thereafter, the conductive layer 141, the adhesive layer 130 and the substrate 110 are drilled to form plural through holes 151 shown in FIG. 4B.

Figure 4A:
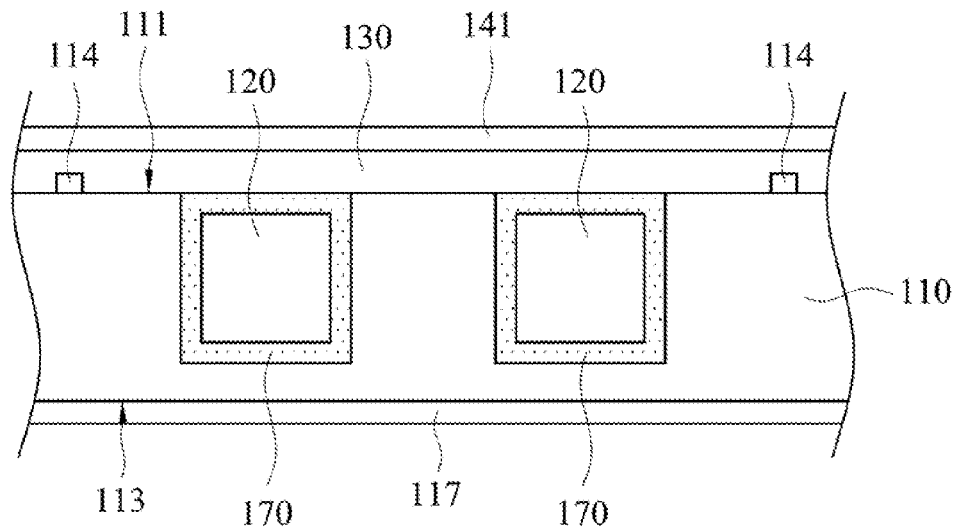
Figure 4B:
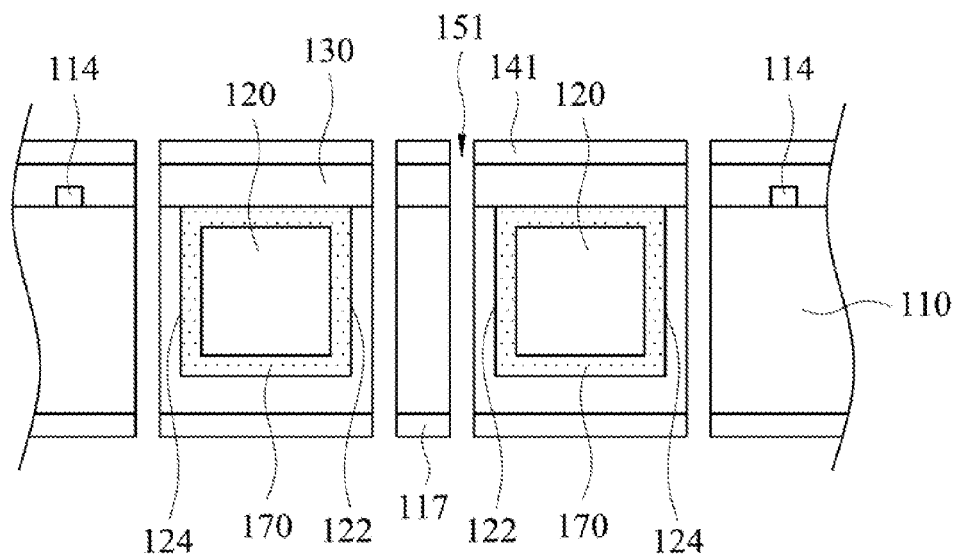
Figure 4C:
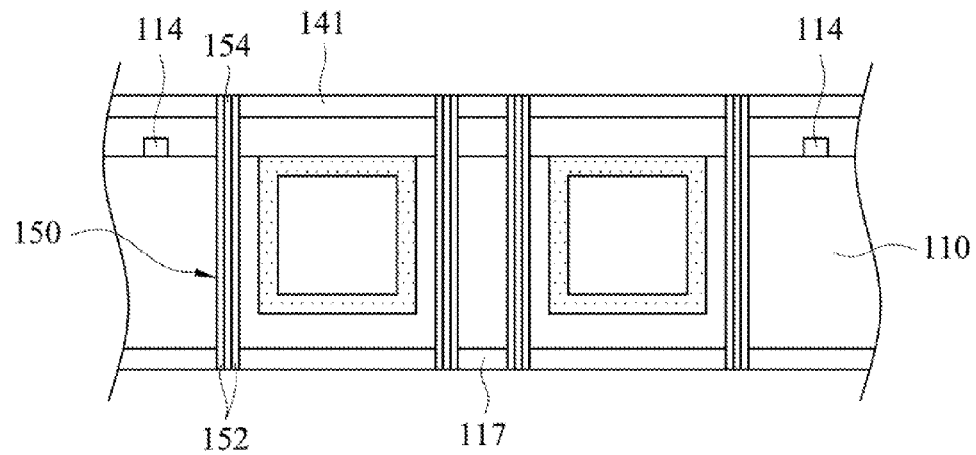
Figure 4D:
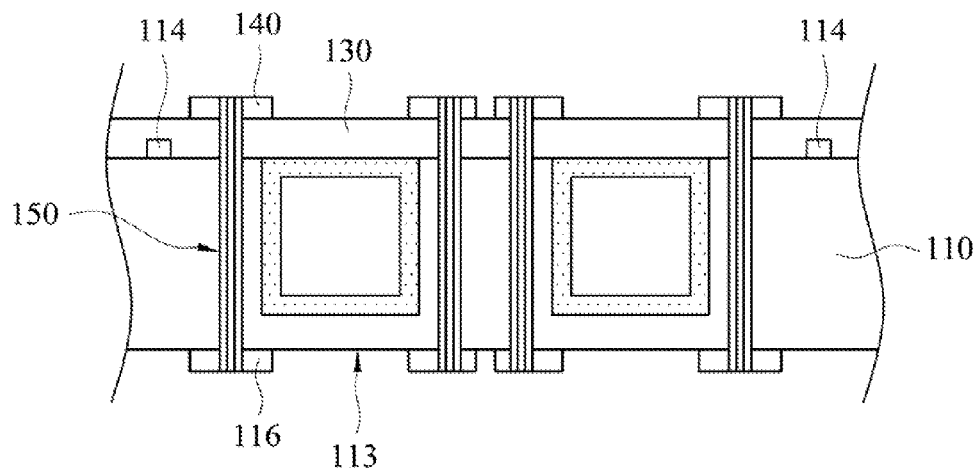

In FIG. 4C, the conductive films 152 are plated in the through holes 151 to form the conductive channels 150, and the first protection layers 154 are formed in the gaps of the conductive channels 150. Afterward, the conductive layer 141 and the second metal layer 117 are patterned, to get the conductive portions 140 and the second metal portions 116 shown in FIG. 4D. Finally the second protection layer 162 (see FIG. 2) is formed on the adhesive layer 130, the conductive channels 150, and the conductive portions 140, and the second protection layer 164 (see FIG. 2) is formed on the second metal portions 116, the conductive channels 150, and the second surface 113 of the substrate 110.

The printed circuit board package structure 100a shown in FIG. 2 is a three-layer package structure. Compared with a conventional four-layer printed circuit board package structure, the printed circuit board package structure 100a can save the time cost of and the material cost the manufacture processes that were needed at conventional process of etching all the second metal layer 113 and of laminating the additional conductive layer. Furthermore, the thickness of the second metal layer 117 is greater than the thickness of the conventional conductive layer which was used to be laminated on the second surface 113, thus enhancing the support strength of the printed circuit board package structure 110a, and reducing the stress which impacts the inductance value.

Figure 5:
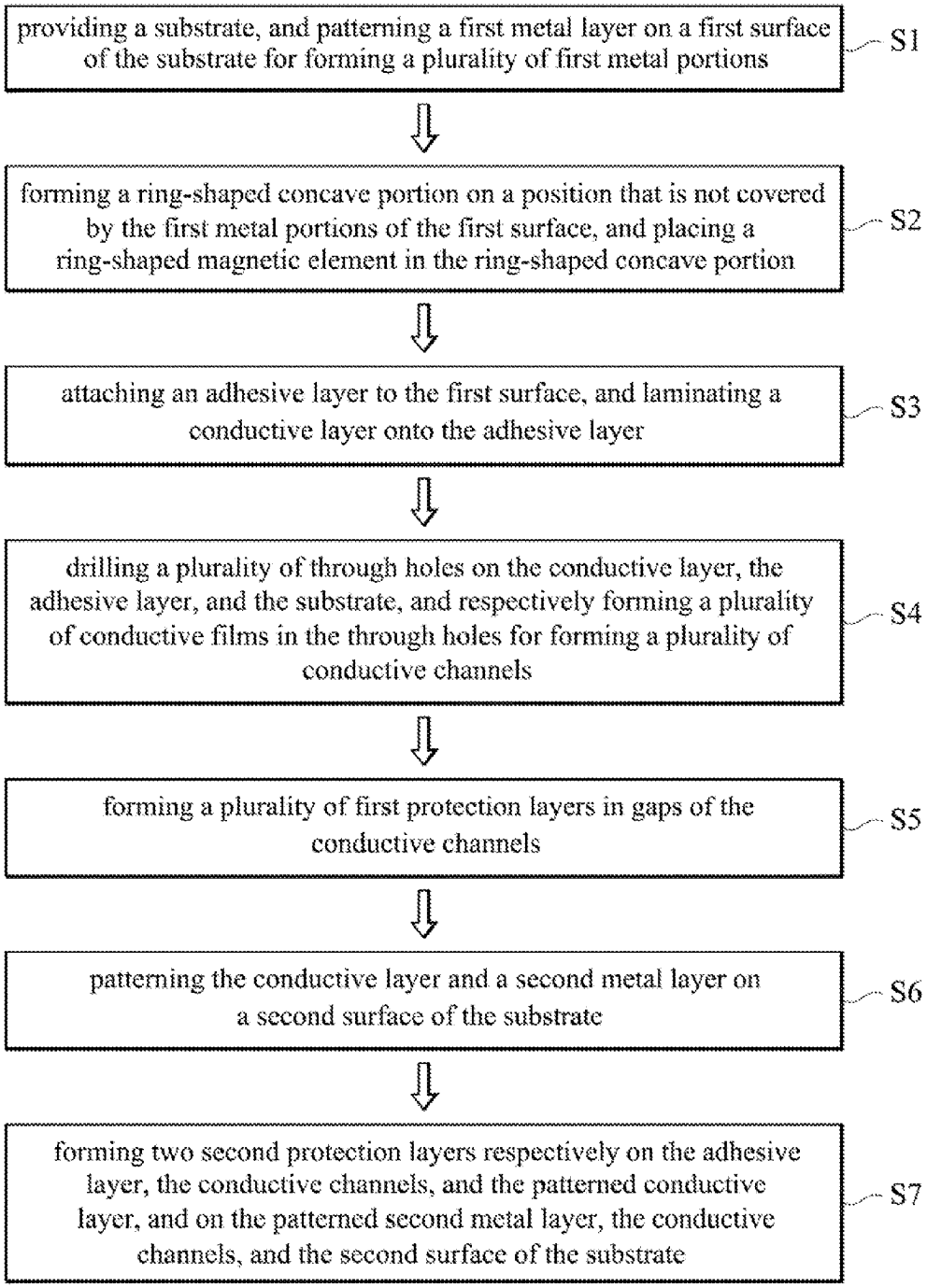
FIG. 5 is a flow chart of a manufacturing method of a printed circuit board package structure according to an embodiment of the present invention.

FIG. 5 is a flow chart of a manufacturing method of a printed circuit board package structure according to an embodiment of the present invention. First in Step S1, providing a substrate, and patterning a first metal layer on a first surface of the substrate for forming a plurality of first metal portions which are used for alignment. Then in Step S2, forming a ring-shaped concave portion on a position that is not covered by the first metal portions of the first surface, and placing a ring-shaped magnetic element in the ring-shaped concave portion. Next in Step S3, attaching an adhesive layer to the first surface, and laminating a conductive layer onto the adhesive layer. Thereafter in Step S4, drilling a plurality of through holes on the conductive layer, the adhesive layer, and the substrate, and respectively forming a plurality of conductive films in the through holes for forming a plurality of conductive channels. The forming method of the conductive films may be copper plating. Next in Step S5, forming a plurality of first protection layers in gaps of the conductive channels. Thereafter in Step S6, patterning the conductive layer and a second metal layer on a second surface of the substrate. Finally in Step S7, forming two second protection layers respectively on the adhesive layer, the conductive channels, and the patterned conductive layer, and on the patterned second metal layer, the conductive channels, and the second surface of the substrate.

Figure 6:
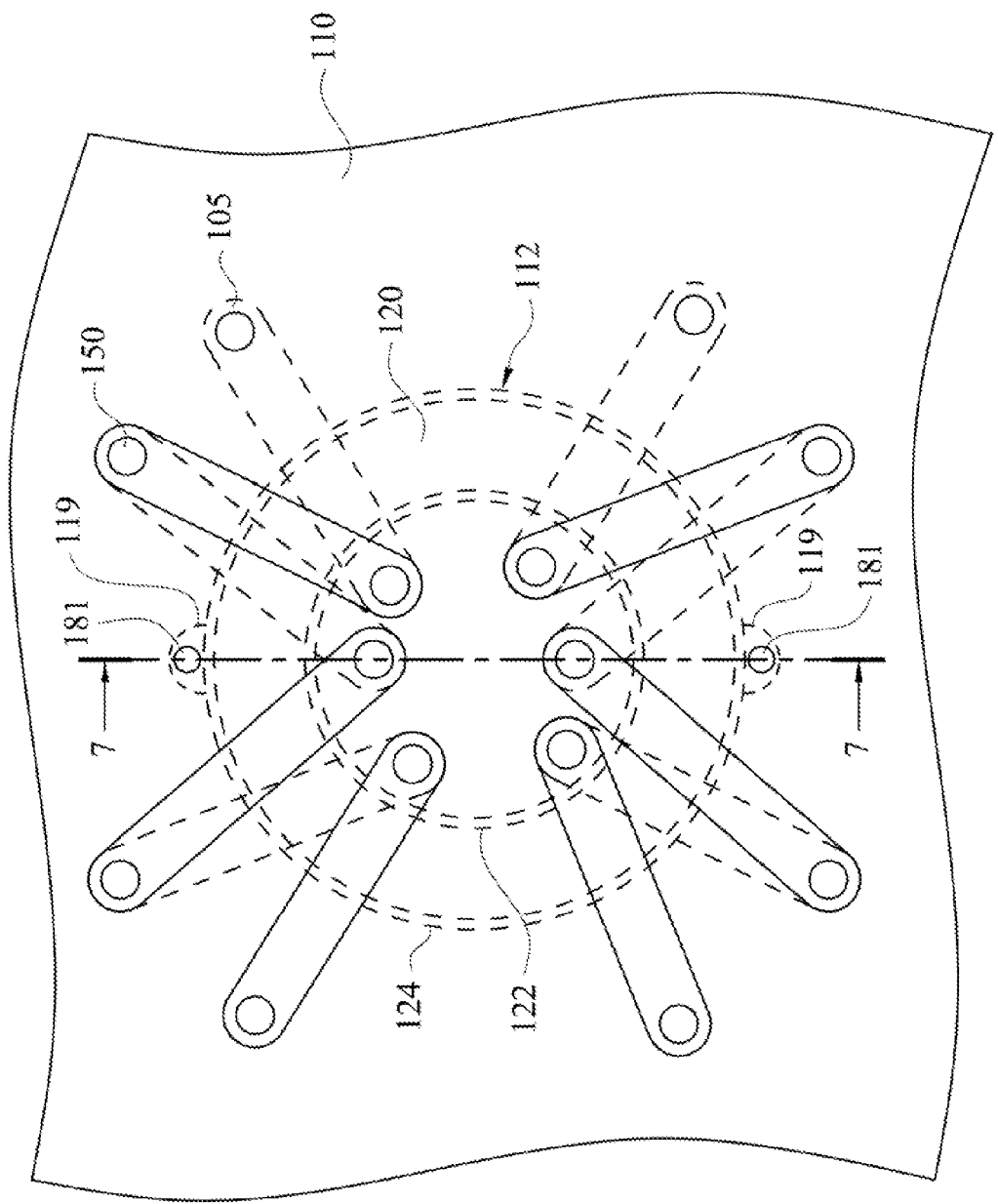
FIG. 6 is a top view of a printed circuit board package structure according to an embodiment of the present invention.
Figure 7:
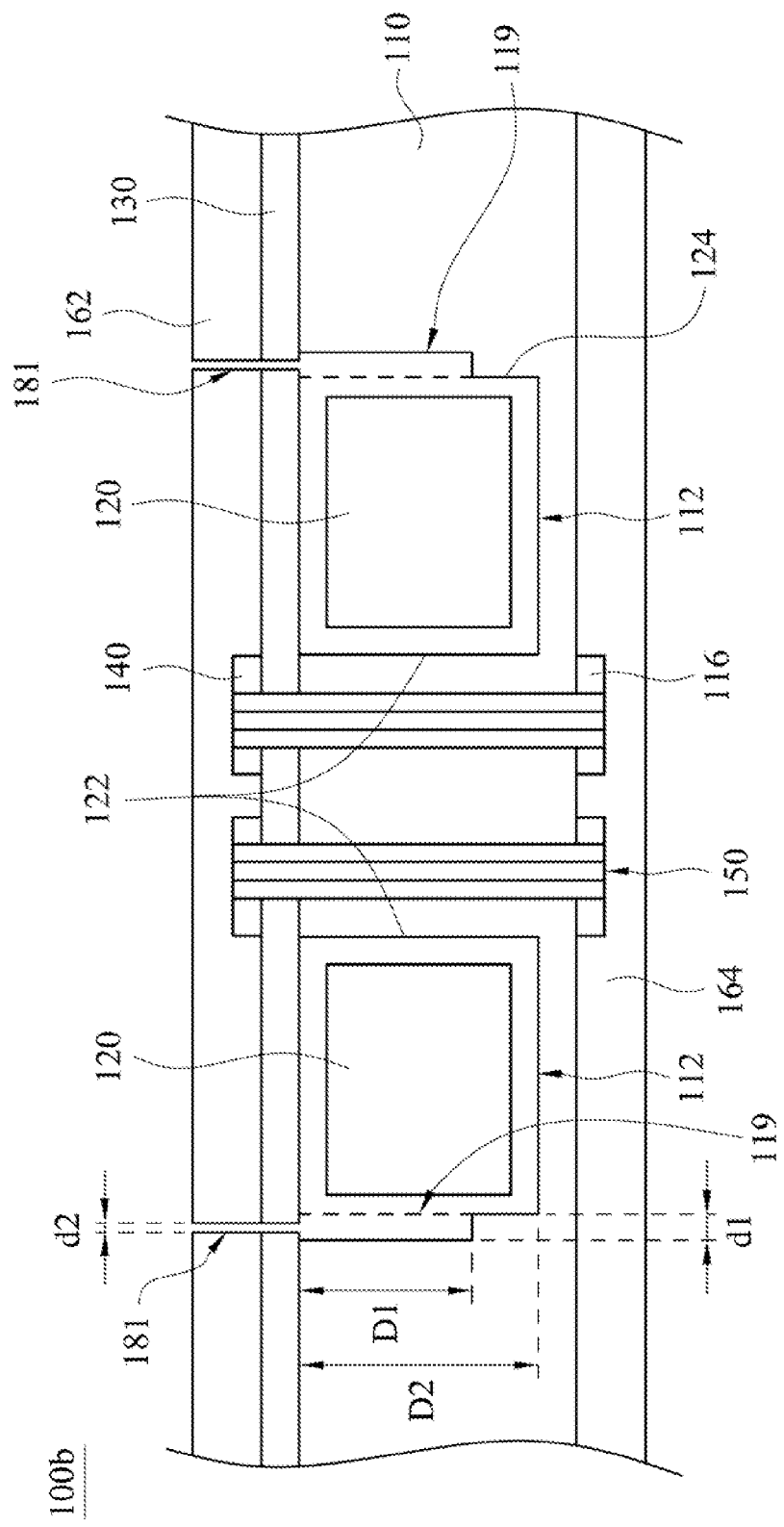
FIG. 7 is a cross-sectional view taken along line 7-7 of FIG. 6.

FIG. 6 is a top view of a printed circuit board package structure 100b according to an embodiment of the present invention. FIG. 7 is a cross-sectional view taken along line 7-7 of FIG. 6. As shown in FIG. 6 and FIG. 7, the printed circuit board package structure 100b includes the substrate 110, the ring-shaped magnetic element 120, the adhesive layer 130, the conductive portions 140, and the conductive channels 150. The difference between this embodiment and the embodiment shown in FIG. 1A and FIG. 2 is that the printed circuit board package structure 100b does not include the adhesive material 170 (see FIG. 2). The substrate 110 includes at least two gas channels 119, and the adhesive layer 130 and the second protection layer 162 on the adhesive layer 130 form at least two pressure relief through holes 181. The gas channels 119 are formed on the outer wall 124 of the ring-shaped concave portion 112 which is not covered by the circuits 105, such that the gas channels 119 may communicate with the ring-shaped concave portion 112. However, in another embodiment, the gas channels 119 may also be formed on the inner wall 122 of the ring-shaped concave portion 112. Moreover, the pressure relief through holes 181 are respectively aligned with the gas channels 119, and respectively communicate with the gas channels 119.

In this embodiment, the shapes of the gas channels 119 may be semicircular, circular, or any shapes easily formed by a route bit along the outer wall 124 or the inner wall 122 of the ring-shaped concave portion 112, but the present invention is not limited in this regard. The bore diameters d1 of the gas channels 119 are greater than or equal to the bore diameters d2 of the pressure relief through holes 181, and the depths D1 of the gas channels 119 are smaller than or equal to the depths D2 of the ring-shaped concave portion 112.

When the printed circuit board package structure 100b is under the process of Surface Mount Technology (SMT), the printed circuit board package structure 100b can release the pressure and remove the heat through the gas channels 119 at the outer wall 124 or the inner wall 122 of the ring-shaped concave portion 112, and through the pressure relief through holes 181 at the adhesive layer 130 and the second protection layer 162 on the adhesive layer 130, thereby saving the cost by omitting the adhesive material 170 (see FIG. 2) within the ring-shaped concave portion 112, and reducing the stress causing by the manufacture processes and by the package structure itself to increase the inductance value about 30%. Moreover, the printed circuit board package structure 100b can avoid the gas in the ring-shaped concave portion during 112 during the IR reflow to expand due to the high temperature (e.g., 270° C.), such that the adhesive layer 130 which covers the substrate 110 and the second protection layer 162 are not damaged.

Figure 8A:
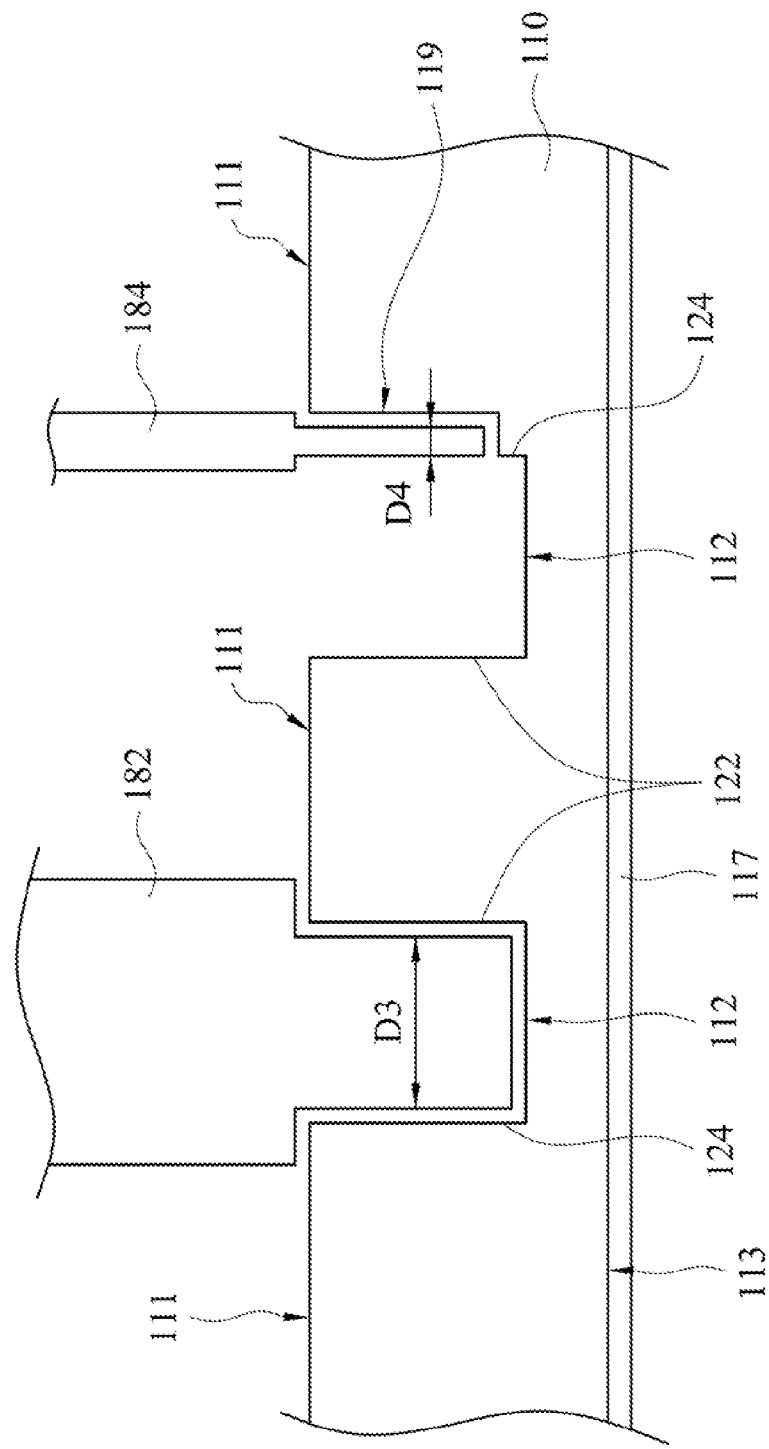
FIG. 8A is a cross-sectional view of a ring-shaped concave portion and a gas channel when being manufactured according to an embodiment of the present invention.

FIG. 8A is a cross sectional view of the ring-shaped concave portion 112 and the gas channels 119 when being manufactured according to an embodiment of the present invention. The ring-shaped concave portion 112 may be formed by using the route bit 182 of the forming machine to contact the first surface 111 of the substrate 110, and the gas channels 119 can be formed by using a drill 184 to penetrate the first surface 111 adjacent to the ring-shaped concave portion 112, but the present invention is not limited in this regard. For instance, the gas channels 119 may also be formed by laser cutting, or formed when using the route bit 182 of the forming machine to form the ring-shaped concave portion 112 by making the route bit 182 contact the inner wall 122 or the outer wall 124, to let the gas channels 119 and the ring-shaped concave portion 112 are formed simultaneously. In this embodiment, the diameter D3 of the route bit 182 is greater than the diameter D4 of the drill 184.

Figure 8B:
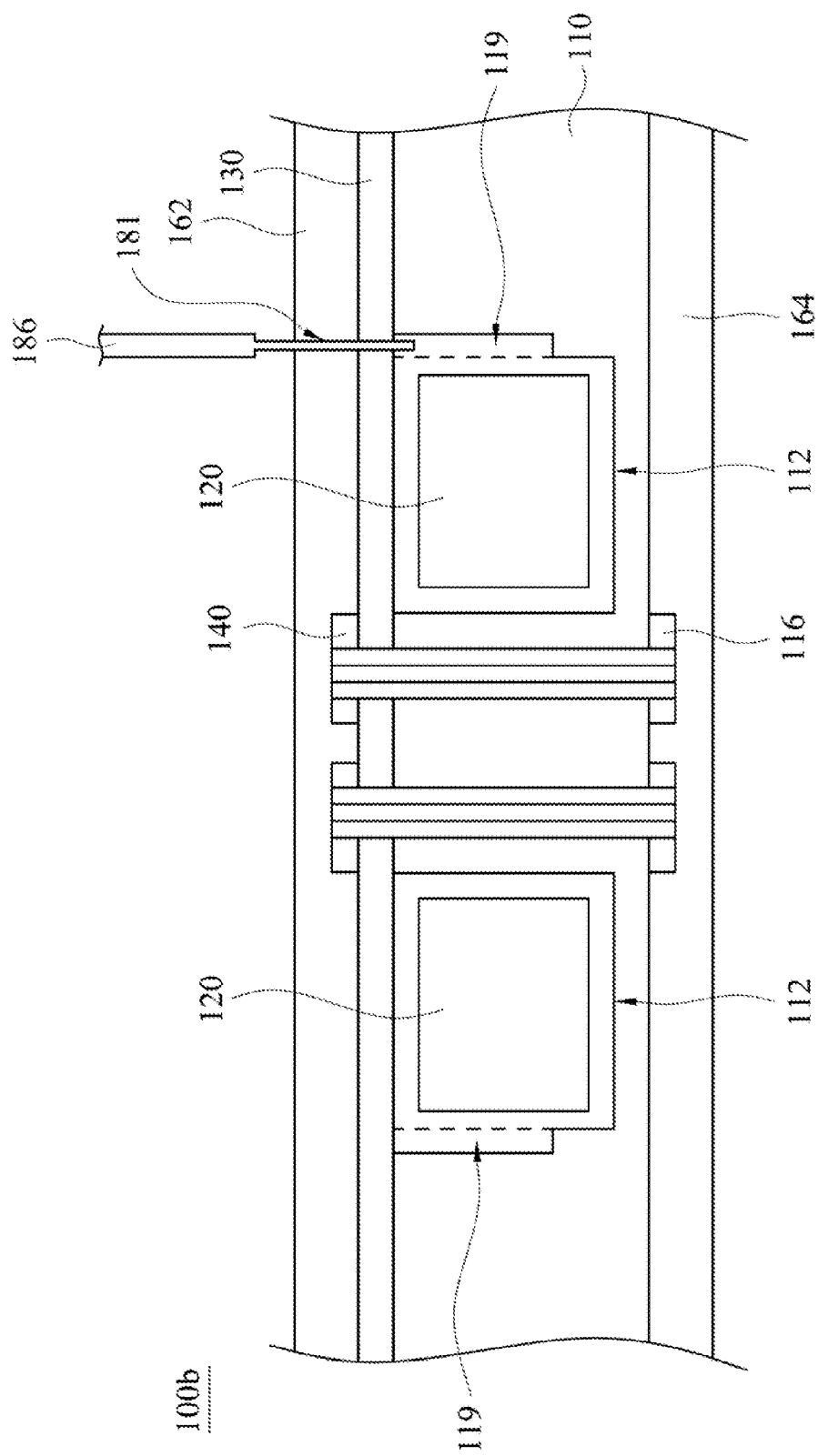
FIG. 8B is a cross-sectional view of pressure relief through holes when being manufactured according to an embodiment of the present invention.

FIG. 8B is a cross-sectional view of pressure relief through holes when being manufactured according to an embodiment of the present invention. After the gas channels 119 are covered by the adhesive layer 130 and the second protection layer 162, and before the printed circuit board package structure 100b is under the process of Surface Mount Technology, by merely using the drill 186 to penetrate the adhesive layer 130 above the gas channels 119 and to penetrate the second protection layer 162, the pressure relief through holes 181 can be formed in the adhesive layer 130 and the second protection layer 162. The pressure relief through holes 181 are respectively be aligned with the gas channels 119 and are respectively communicate with the gas channels 119.

In practical application, the diameters of the pressure relief through holes 181 are about 0.2 mm~1 mm, which is great enough to release the pressure and remove the heat during high temperature manufacturing processes. Furthermore, there are at least two pressure relief through holes 181 to facilitate the convection of the hot gas and the stress in the hermetic space within the ring-shaped concave portion 112, and to avoid the ring-shaped magnetic element 120 moving to the corner where the pressure relief through holes 181 located (e.g., the upper right corner of the ring-shaped concave portion 112 shown in FIG. 8B) and covering or partially covering the only gas channel 119 when only one pressure relief through hole 181 is placed, thereby affecting the convection of the hot gas and the stress, but the present invention is not limited in this regard. For example, when the gas channels 119 are formed at the edges of the printed circuit board package structure 100b, the follow-up process of cutting the edges of the print circuit board can cut away a part of the gas channels 119 to communicate with the outside. Or, when the channel which used to communicate with the outside is greater than 1 mm, or when the area which is used to communicate with the outside is big enough to make the convection of the hot gas and the stress successfully, only one pressure relief through hole 181 may also avoid the adhesive layer or the epoxy resin being damaged.

Furthermore, when the conductive channels 150 (see FIG. 7) are arranged in dense, it is allowed that to use the route bit 182 or use a laser cutting to form the gas channels 119 between two adjacent ring-shaped concave portions 112, and then the pressure relief through holes 181 are formed to communicate with the gas channels 119, such that the manufacture processes and the required cost may be reduced.

It is to be noted that the structures and the material described above will be repeated in the following description.

Figure 9A:
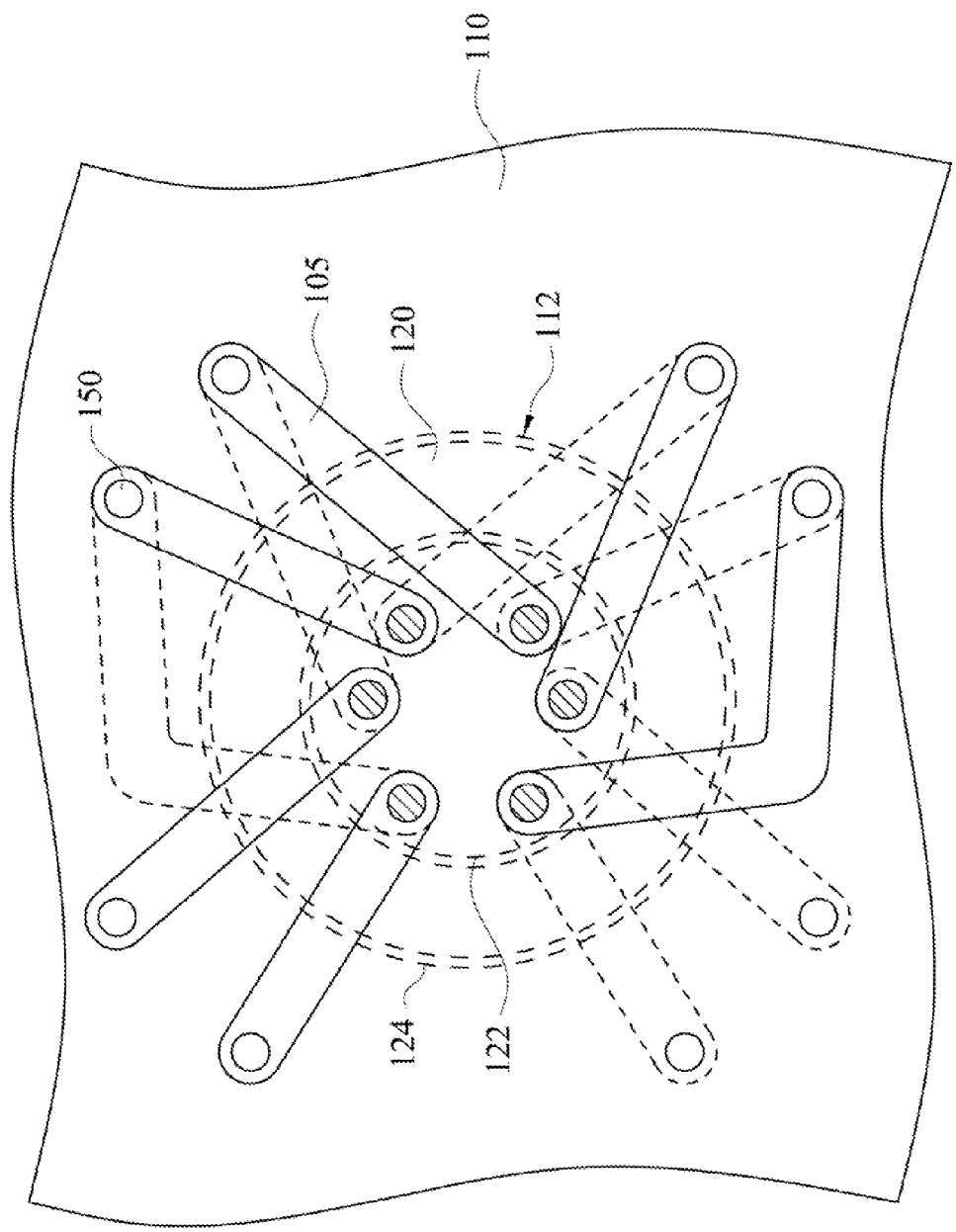
FIG. 9A is a top view of a printed circuit board package structure according to an embodiment of the present invention.
Figure 9B:
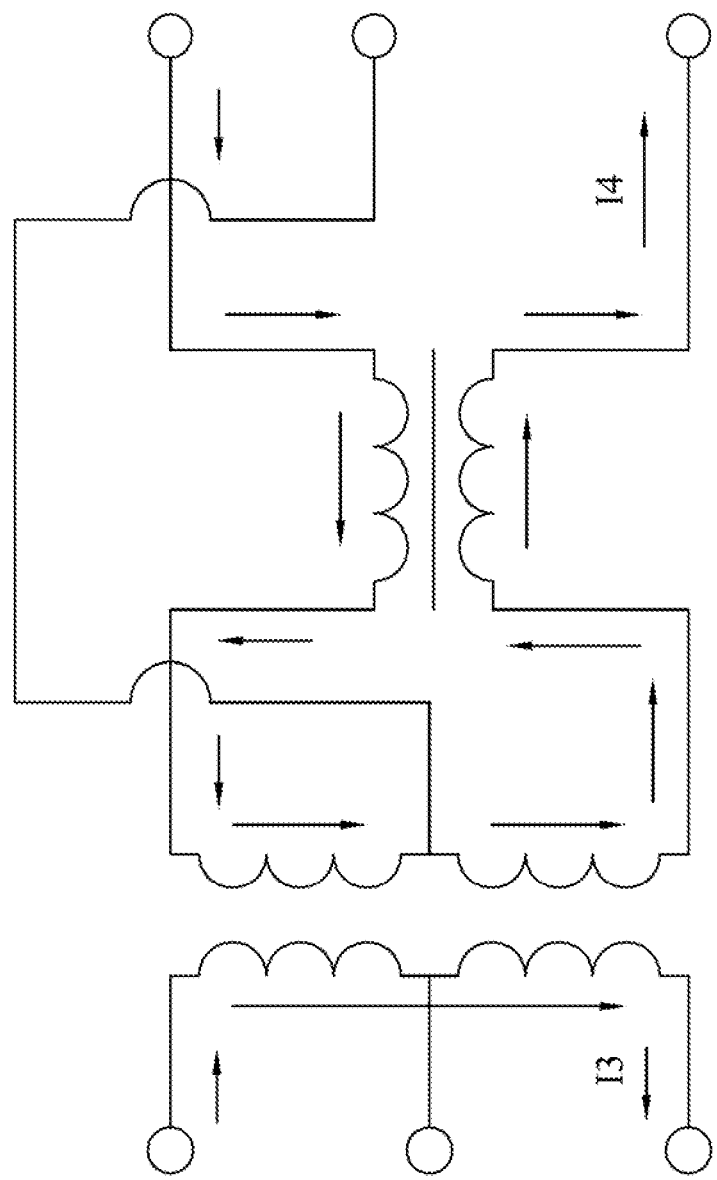
FIG. 9B is a schematic view of an equivalent circuit of FIG. 9A.

FIG. 9A is a top view of a printed circuit board package structure 100c according to an embodiment of the present invention. FIG. 9B is a schematic view of an equivalent circuit of FIG. 9A. As shown in FIG. 9A and FIG. 9B, the printed circuit board package structure 100c includes the conductive channels 150 and the circuits 105. In this embodiment, the printed circuit board package structure 100c is a transformer, which can allow the electric current I3 and the electric current I4 passing through.

The printed circuit board package structure 100c is a three-layer package structure, the cross-sectional structure of the printed circuit board package structure 100c can be understood by referring to the structure of the printed circuit board package structure 100a shown in FIG. 2. As shown in FIG. 2 and FIG. 9A, the printed circuit board package structure 100c includes the substrate 110, the ring-shaped magnetic element 120, the adhesive layer 130, the conductive portions 140, and the conductive channels 150. In this embodiment, the printed circuit board package structure 100c includes an adhesive material 170 within the ring-shaped concave portion 112.

Moreover, in practical applications, the circuits 105 in FIG. 9A can be formed on inner layers of the second protection layers 162, 164, and selectively electrically connect to two of the conductive portions 140 adjacent to the inner wall 122 and the outer wall 124 of the ring-shaped concave portion 112, or electrically connect to two of the second metal portions 116 adjacent to the inner wall 122 and the outer wall 124 of the ring-shaped concave portion 112, such that the circuits 105 on the second protection layers 162, 164 can be conducted by the conductive channels 150, thus achieve the effect of winding wires on the ring-shaped magnetic element 120.

Figure 10A:
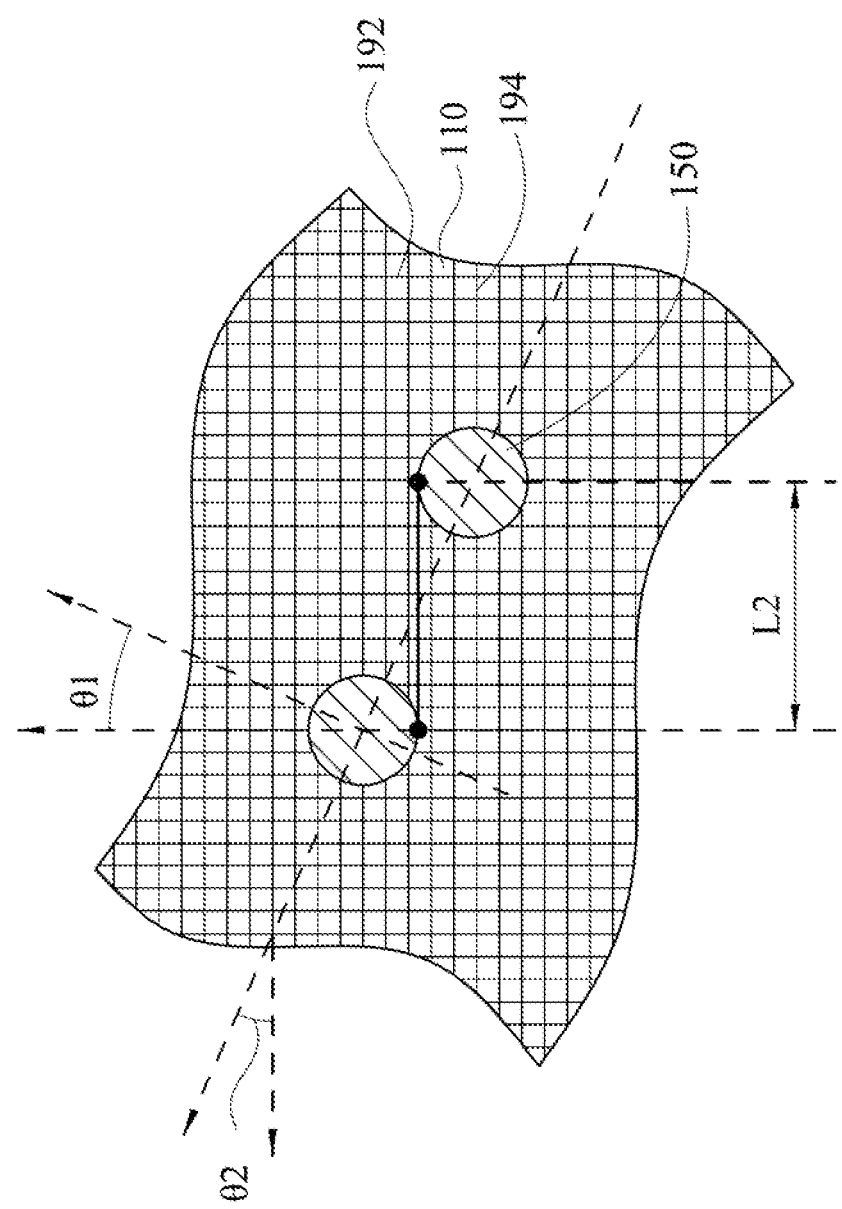
FIG. 10A is a schematic view of two adjacent conductive channels within the inner wall of the ring-shaped concave portion and the longitudinal fibers and the transverse fibers of the substrate shown in FIG. 9A.
Figure 10B:
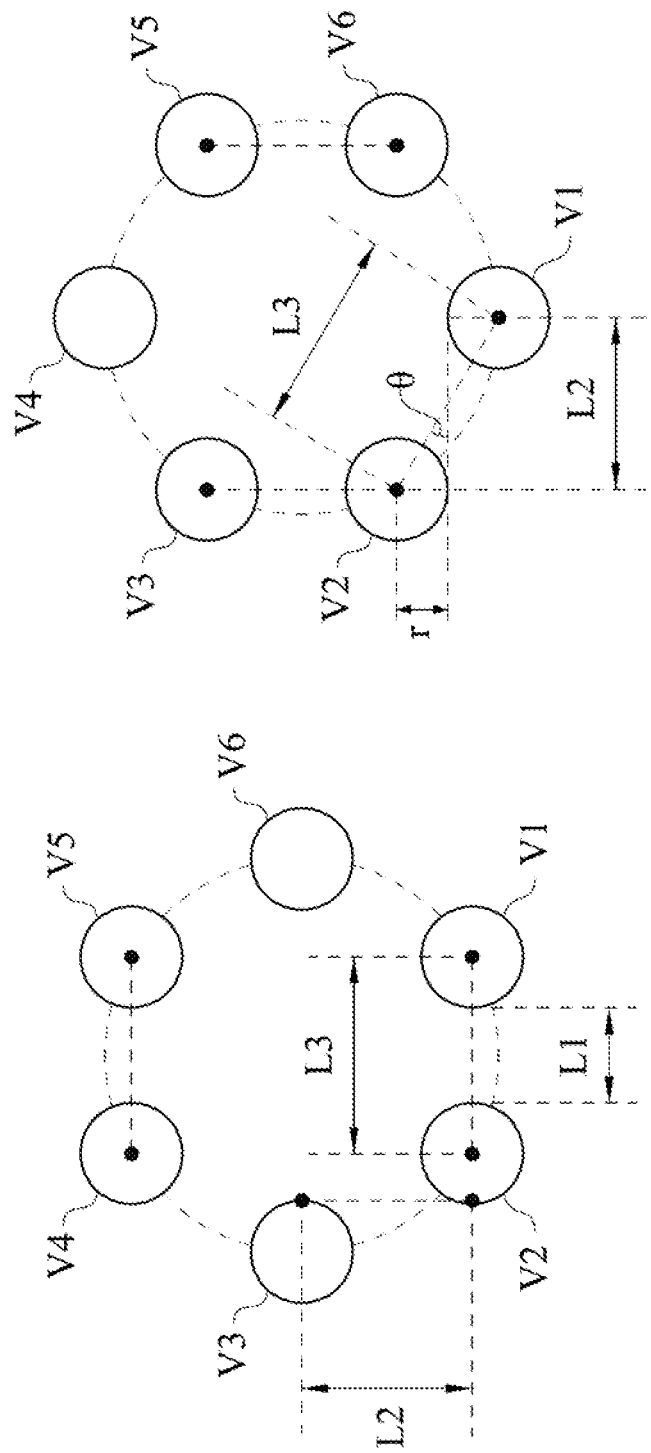
FIG. 10B is a schematic view of the conductive channels within the inner wall of the ring-shaped concave portion when being twisted an angle along the longitudinal fibers and the transverse fibers of the substrate shown in FIG. 9A.

FIG. 10A is a schematic view of two adjacent conductive channels 150 within the inner wall 122 of the ring-shaped concave portion 112 and the longitudinal fibers 192 and the transverse fibers 194 of the substrate 110 shown in FIG. 9A. FIG. 10B is a schematic view of the conductive channels 150 within the inner wall 122 of the ring-shaped concave portion 112 when being twisted an angle along the longitudinal fibers 192 and the transverse fibers 194 of the substrate 110 shown in FIG. 9A. As shown in FIG. 9A, FIG. 10A, and FIG. 10B, the conductive channels 150 within the inner wall 122 of the ring-shaped concave portion 112 are arranged evenly in an approximate ring-shaped formation, such as the conductive channels 150 connected in slashes within the inner wall 122 of the ring-shaped concave portion 112 shown in FIG. 9A. The substrate 110 is a glass fiber substrate, which includes a plurality of longitudinal fibers 192 and a plurality of transverse fibers 194, and the transverse fibers 194 are respectively perpendicular to the longitudinal fibers 192. The longitudinal fibers 192, the transverse fibers 194, and the conductive channels 150 arranged in an approximate ring-shaped formation at the drilling positions of the substrate 110 are at a proper angle depending on the longitudinal and latitudinal layout of the fibers. In this embodiment, by calculating a proper angle at which the conductive channels 150 at drilling positions of the substrate 110 required to twist depending on the longitudinal and latitudinal layout of the glass fibers, such that the conductive films 152 (see FIG. 2) on the adjacent conductive channels 150 do not easily conduct due to the cracks formed along the through holes. In the following description, the meanings and the utility of "the proper angle at which the conductive channels 150 at the drilling positions depending on the longitudinal and latitudinal layout of the glass fibers" will be described.

In this embodiment, the number of the conductive channels 150 which placed within the inner wall 122 of the ring-shaped concave portion 112 are arranged evenly in an approximate ring-shaped formation and are marked by sloped line is six, and the radii of the conductive channels 150 are r. In the left diagram of FIG. 10B, two adjacent conductive channels V1 and V2 are both located at the positions that are parallel to the transverse fibers 194, and the distance between the two adjacent conductive channels V1 and V2 along the transverse fibers 194 is L1, and a distances between centers of the two adjacent conductive channels V1 and V2 is L3. In the right diagram of FIG. 10B, after the conductive channels 150 at the drilling positions of the substrate 110 twist a twist angle $\theta$ (pattern twist angle) in a clockwise direction, a distance between the two adjacent conductive channels V1 and V2 along the transverse fibers 194 is L2, and L2 is greater than L1, and a transverse fiber 194 is tangent to both the circumference of the conductive channels V1 and the circumference of the conductive channels V2. As a result, $\theta = \text{Sin}^{-1}(2r/L3)$. That is, in FIG. 10A, an angle between an alignment direction of the conductive channels 150 and the longitudinal fibers 192 is $\theta 1$, and an angle between an alignment direction of the conductive channels 150 and the transverse fibers 194 is $\theta 2$, and both $\theta 1$ and $\theta 2$ are equal to $\theta$.

In all the embodiments which the conductive channels 150 twist a twist angle at the drilling positions of the substrate 110, and there is a transverse fiber 194 connect the circumference of the conductive channel V1 and the circumference of the conductive channel V2, due to a transverse fiber 194 is tangent with both the circumference of the conductive channel V1 and the circumference of the conductive channel V2, and L2 is a longest distance that the transverse fibers 194 connects to the conductive channel V1 and the conductive channel V2. And when $\theta > \text{Sin}^{-1}(2r/L3)$, since there is no transverse fibers 194 which connect the two adjacent conductive channels V1 and V2, the conductive films 152 (see FIG. 2) required to be along both the transverse fibers 194 and the longitudinal fibers 192 to conduct through the cracks formed by drilling the through holes.

Moreover, in this embodiment, L3 is four times of r, therefore $\theta = 30°$. Although L2 is a longest distance that the transverse fibers 194 connect to the conductive channel V1 and the conductive channel V2. transverse fibers 194, other adjacent conductive channels, such as V2 and V3, or V5 and V6 will be located at positions that parallel to the longitudinal fibers 192 after the twist. Therefore, a distance between the two conductive channels V2 and V3 along the longitudinal fibers 192 is reduced to L1. That is to say, originally twisting the drilling positions to make the distance between the two adjacent conductive channels V1 and V2 along the transverse fibers 194 to be extended as L2 is to avoid the conductive films 152 (see FIG. 2) of the two adjacent conductive channels V1 and V2 to be connected to be short circuiting through the cracks along the transverse fibers 194 due to the through holes, but this will also make the distance between other adjacent conductive channels V2 and V3 along the longitudinal fibers 192 to be shortened to be L1.

Since the conductive channels 150 are mostly to be symmetric arrangement at one of the longitudinal orientation and latitudinal orientation, in another embodiment, the twist angle θ may be reduced to be $\frac{1}{2}(\sin^{-1}(2r/L3))$, such that the distances of the adjacent conductive channels 150 along the transverse fibers 194 or along the longitudinal fibers 192 can be extended. And a greater distance of other adjacent conductive channels at another of the longitudinal orientation and latitudinal orientation which was originally along the longitudinal fibers 192 or along the transverse fibers 194 is not to be shorten too much. In practical applications, a radius of the inner diameter of the ring-shaped magnetic element 120 is about 0.5 mm~10 mm, and a diameter of the inner wall 122 of the ring-shaped concave portion 112 is slightly smaller than the diameter of the ring-shaped magnetic element 120. Radii r of the conductive channels 150 are about 0.075 mm~2.75 mm. The number of the conductive channels 150 within the inner wall 122 of the ring-shaped concave portion 112 is greater than or equal to 6. The transformer must withstand a voltage around 500 V~4000 V. Distances between centers of any two adjacent conductive channels 150 are L, and each of distances between centers of any two adjacent conductive channels 150 is not necessary to be the same as that of others. If angles between a line running through the centers of any two adjacent conductive channels and the longitudinal fibers 192, and angles between a line running through the centers of any two adjacent conductive channels and the transverse fibers 194 are greater than or equal to $\frac{1}{2}(\sin^{-1}(2r/L))$, the conductive films 152 of the two adjacent conductive channels 150 thereby may avoid short circuiting due to cracks connect with each other along the through holes (i.e., drilling positions) under a requirement of a specific withstand voltage.

Furthermore, when the number of the conductive channels 150 is larger, with the same condition of the diameter of the inner wall 122 of the ring-shaped concave portion 112, for extending the distances of adjacent conductive channels 150 along the fibers, the radii r of the conductive channels 150 need to be shortened, and the distances L3 between centers of any two adjacent conductive channels 150 will be reduced due to the number of the conductive channels 150 is increased. For extending the distances between the two conductive channels 150 along the fibers, the shapes of the conductive channels 150 are not limited to be arranged in an ring-shaped formation, the conductive channels 150 may be placed in an arrangement of any shapes as long as the conductive channels 150 don't overlap or intersect with each other.

The conductive channels 150 out of the outer wall 124 of the ring-shaped concave portion 112 are with larger space to be arranged than the conductive channels 150 inside the inner wall 122 of the ring-shaped concave portion 112 since it is not restricted by the inner space of the ring-shaped concave portion 112, thereby the distance between any two adjacent conductive channels 150 can be extended to enlarge along the fibers. Or to compare the distances of any two adjacent conductive channels 150 out of the outer wall 124 of the ring-shaped concave portion 112 along the fibers with the distances of any two adjacent conductive channels 150 inside the inner wall 122 of the ring-shaped concave portion 112 along the fibers, if the former is smaller than that of the distances of any two adjacent conductive channels 150 inside the inner wall 122 of the ring-shaped concave portion 112 along the fibers, the conductive channels 150 are required to be twisted depending on the longitudinal and latitudinal layout of the fibers until the distances along the fibers of which is large enough to avoid the conductive films 152 being short circuited due to cracks connect with each other along the through holes under a requirement of a specific withstand voltage.

Specifically, when the radii of the conductive channels 150 are r, or when the radii of two adjacent conductive channels 150 are different from each other, a smaller radius of the two radii is r, and a distance between centers of the two adjacent conductive channels 150 is L, angles between lines running through centers of the two adjacent conductive channels 150 within the inner wall 122 of the ring-shaped concave portion 112 and the longitudinal fibers 192 as well as angles between the lines running through the centers of the two adjacent conductive channels 150 within the inner wall 122 of the ring-shaped concave portion 112 and the transverse fibers 194, are all greater than or equal to $\frac{1}{2}(\sin^{-1}(2r/L))$. In addition, the distances along the fibers between any two adjacent conductive channels 150 out of the outer wall 124 of the ring-shaped concave portion 112 are all greater than or equal to a shortest distance among the distances along the fibers between any two adjacent conductive channels 150 within the inner wall 122 of the ring-shaped concave portion 112.

When the conductive channels 150 is designed, proper angles at which the conductive channels 150 at drilling positions of the substrate 110 required to twist can be calculated depending on longitudinal and latitudinal layout of the fibers, such that the distances between centers of any two adjacent conductive channels 150 are L, and the angles between lines running through centers of any two adjacent conductive channels 150 within the inner wall 122 of the ring-shaped concave portion 112 and the longitudinal fibers 192 as well as the angles between the lines running through the centers of any two adjacent conductive channels 150 in the inner wall 122 of the ring-shaped concave portion 112 and the transverse fibers 194, are all greater than or equal to $\frac{1}{2}(\sin^{-1}(2r/L))$. Moreover, the distances along the fibers between any two adjacent conductive channels 150 inside the inner wall 122 of the ring-shaped concave portion 112 are calculated to get a shortest distance among the distances. Compared with the shortest distance and the distances along the fibers between any two adjacent conductive channels 150 out of the outer wall 124 of the ring-shaped concave portion 112, if the distances along the fibers between any two adjacent conductive channels 150 outside the outer wall 124 of the ring-shaped concave portion 112 are smaller than the aforementioned shortest distance, lengthen the distances along the fibers between any two adjacent conductive channels 150 outside the outer wall 124 of the ring-shaped concave portion 112, or twist the drilling positions of the substrate 110 depending on the longitudinal and latitudinal layout of the fibers so that the distances along the fibers between any two adjacent conductive channels 150 outside the outer wall 124 of the ring-shaped concave portion 112 are greater than or equal to the aforementioned shortest distance, such that the conductive films 152 avoid short circuiting due to cracks formed along the through holes under a requirement of a specific withstand voltage.

When the conductive channels 150 are manufactured, the following factors should be taken in consideration:

(1) The radius of the magnetic element, the number of the conductive channels, the radii of the conductive channels, and the relative positions of the conductive channels at the substrate and the longitudinal and latitudinal layout of the glass fibers will all affect the shortest distance of the adjacent conductive channels along the glass fibers. The larger the requirement of a withstand voltage, the larger the shortest distance, to avoid the conductive films 152 of the conductive channels 150 being short circuited due to cracks connect with each other along the through holes under a requirement of a specific withstand voltage.

(2) In practical applications, under the requirement of a specific withstand voltage, for extending the said shortest distance, the drilling positions of the through holes are required to be twisted a twist angle.

(3) Proper angles to be twisted may lengthen the distance of the adjacent conductive channels along the glass fibers that was originally too short. Although the larger distance the hard it is to be short circuited, an excessive twist angle will make a distance of other adjacent conductive channels at another of the longitudinal orientation and latitudinal orientation to be shorten and thus leading to the short circuiting.

(4) The patterns and the tightness of how the glass fibers are weaved together also affect the aforementioned shortest distance and the proper angles of twist. The weaving patterns of the glass fibers include the square, the rectangular, or various other overlapping patterns. The weaving patterns of the glass fibers will affect whether the conductive films of the adjacent conductive channels will make connections through the cracks along the glass fibers of different longitudinal orientation and latitudinal orientation (e.g., turning from the longitudinal orientation to the latitudinal orientation, or from latitudinal orientation to the longitudinal orientation).

(5) The shapes of the conductive channels can be arranged in a ring-shaped formation, for lengthening the distances of the adjacent conductive channels along the fibers, and the conductive channels can be placed in an arrangement of any shapes.

Figure 11:
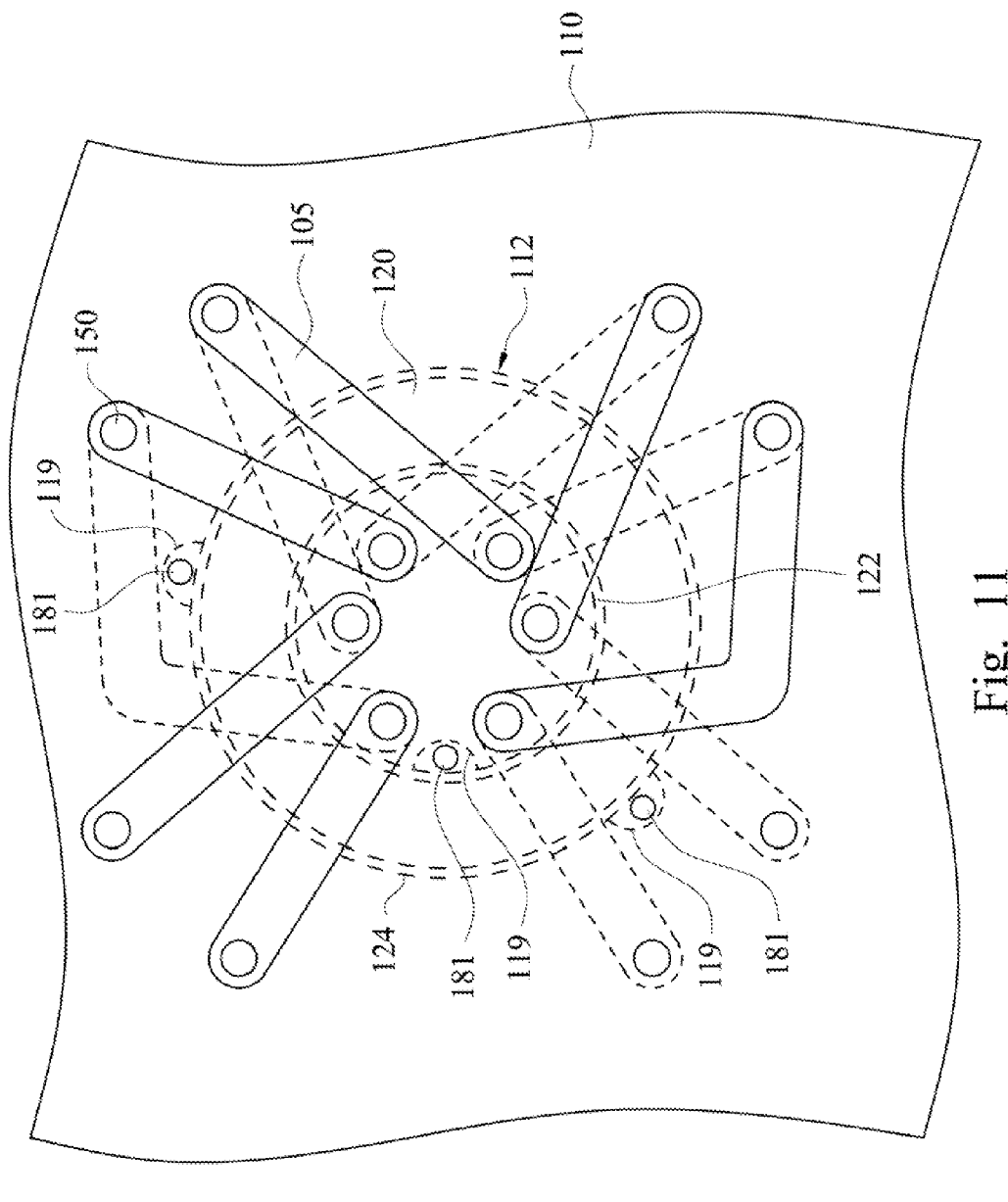
FIG. 11 is a top view of a printed circuit board package structure according to an embodiment of the present invention.

FIG. 11 is a top view of a printed circuit board package structure 100d according to an embodiment of the present invention. The printed circuit board package structure 100d is a three-layer package structure, and the cross-sectional structure of the printed circuit board package structure 100d can be understood by referring to the printed circuit board package structure 100b shown in FIG. 7. As shown in FIG. 7 and FIG. 11, the printed circuit board package structure 100d includes the substrate 110, the ring-shaped magnetic element 120, the adhesive layer 130, the conductive portions 140, and the conductive channels 150. The difference between this embodiment and the embodiment shown in FIG. 10A is that the printed circuit board package structure 100d does not include an adhesive material 170 (see FIG. 2), and the substrate 110 includes three gas channels 119. One of the three gas channels 119 is formed on a position that is not covered by the circuits 105 at the inner wall 122 of the ring-shaped concave portion 112, and other two of the three gas channels 119 are formed on the positions that are not covered by the circuits 105 at the outer wall 124 of the ring-shaped concave portion 112. At least two pressure relief through holes 181 are formed on the adhesive layer 130 and the second protection layers 162 on the adhesive layer 130. The two pressure relief through holes 181 are respectively aligned with the gas channels 119 and respectively communicate with the gas channels 119.

As shown in FIG. 10A and FIG. 11, in this embodiment, the printed circuit board package structure 100d have the similar designs of angles relative to the longitudinal orientation and latitudinal orientation between the longitudinal fibers 192, the transverse fibers 194 of the substrate 110, and the conductive channel 150 inside the inner wall 122 of the ring-shaped concave portion 112 shown in FIG. 10A. That is, the angles between lines running through centers of two adjacent conductive channels 150 and the longitudinal fibers 192, as well as angles between the lines running through the centers of the two adjacent conductive channels 150 and the transverse fibers 194, are all greater than or equal to $\frac{1}{2}(\mathrm{Sin}^{-1}(2r/L3))$.

Figure 12:
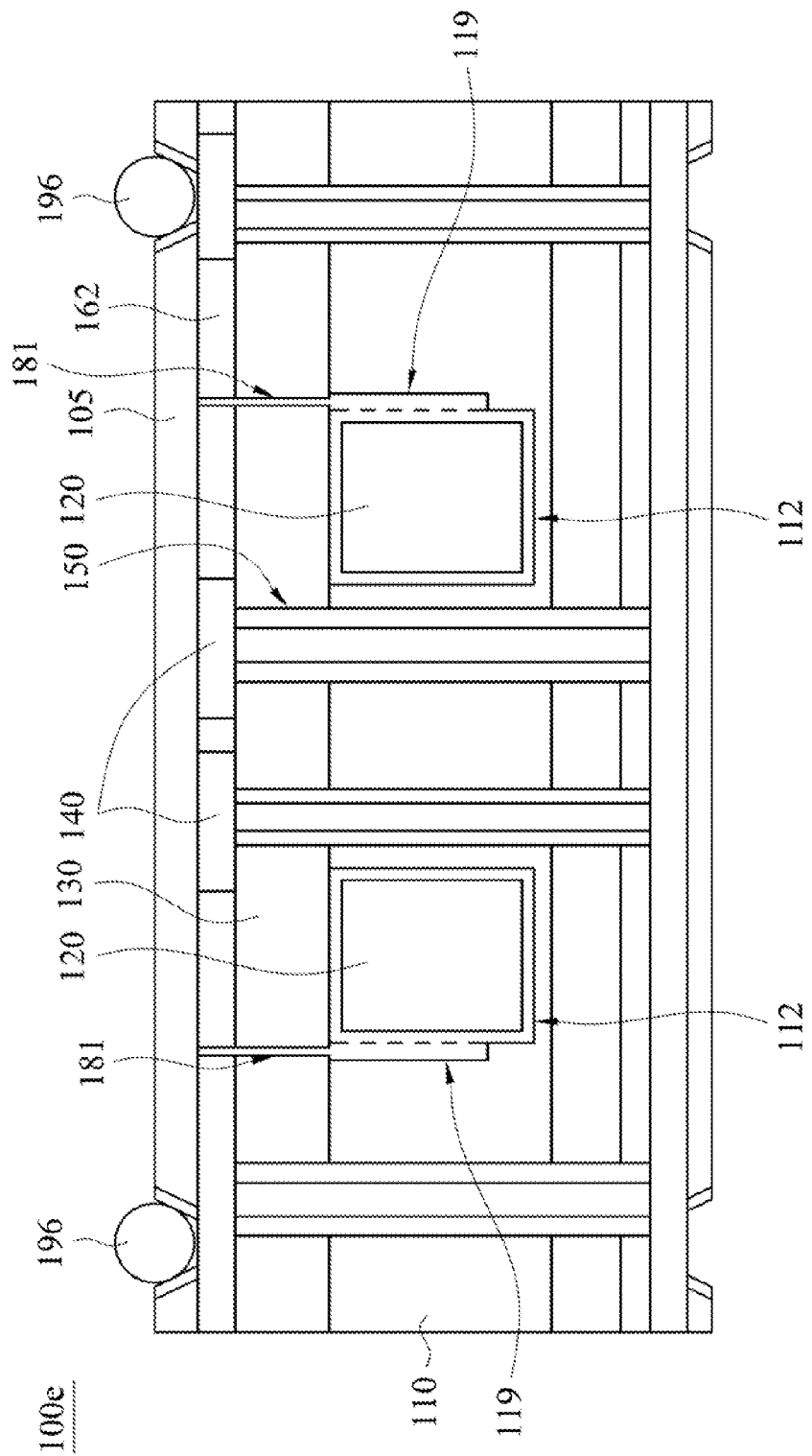
FIG. 12 is a cross-sectional view of a printed circuit board package structure according to an embodiment of the present invention.

FIG. 12 is a cross-sectional view of a printed circuit board package structure 100e according to an embodiment of the present invention. The printed circuit board package structure 100e is a power meter, which is a three-layer package structure. In other words, the printed circuit board package structure 100e also includes the substrate 110, the ring-shaped magnetic element 120, the adhesive layer 130, the conductive portions 140, and the conductive channels 150.

In this embodiment, the printed circuit board package structure 100e does not include an adhesive material 170 (see FIG. 2). The substrate 110 includes the gas channels 119. The pressure relief through holes 181 are formed on the adhesive layer 130 and the second protection layers 162 on the adhesive layer 130. The pressure relief through holes 181 are respectively aligned with the gas channels 119 and respectively communicate with the gas channels 119. Furthermore, the printed circuit board package structure 100e has the similar designs of angles relative to the longitudinal orientation and latitudinal orientation between the longitudinal fibers 192, the transverse fibers 194 of the substrate 110, and the partial of the conductive channel 150 arranged in a ring-shaped formation shown in FIG. 10A. Moreover, the printed circuit board package structure 100e may further include an electrode 196 above the conductive portion 140 to connect with other elements.

Compared with the convectional technology, the present invention has the following advantages: (1) The printed circuit board package structure can save the time cost of the manufacture processes and the required material cost that were needed at the conventional process of etching all the second metal layer and of laminating the additional conductive layer. In addition, the magnetic elements are very sensitive to the stress, so that the electrical characteristics of the magnetic elements may be degraded or damaged due to the stress causing by the manufacture processes and by the package structure itself. The three-layer package structure allow the thickness of the second metal layer being greater than the thickness of the conventional conductive layer laminated on the second surface, thus enhancing the support strength of the printed circuit board package structure, and reducing the stress which impacts the inductance value. (2) When the printed circuit board package structure is under the process of Surface Mount Technology (SMT), the printed circuit board package structure can release the pressure and remove the heat through the gas channels at the outer wall or the inner wall of the ring-shaped concave portion, and through the pressure relief through holes in the adhesive layer and the second protection layers on the adhesive layer, thereby saving the cost by omitting the adhesive material within the ring-shaped concave portion, thus reducing the stress due to the manufacture processes and due to the package structure itself to improve the inductance value, and avoiding the gas in the ring-shaped concave portion expanding during the IR reflow due to the high temperature and hence avoiding the adhesive layer which covers the substrate and the second protection layers being damaged. (3) The radii of the conductive channels within the inner wall of the ring-shaped concave portion are r, the distances between centers of any two adjacent conductive channels are L, angles between lines running through centers of any two adjacent conductive channels and the longitudinal fibers as well as angles between the lines running through the centers of two adjacent conductive channels and the transverse fibers, are all greater than or equal to $\frac{1}{2}(\mathrm{Sin}^{-1}(2r/L))$, such that the conductive films of the adjacent conductive channels avoid short circuiting due to cracks connect with each other along the through holes under a requirement of a specific withstand voltage.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A printed circuit board package structure comprising:
   a substrate comprising a first surface, and a second surface opposite to the first surface, a plurality of longitudinal fibers, and a plurality of transverse fibers respectively perpendicular to the longitudinal fibers, wherein the first surface and the second surface respectively have a plurality of first metal portions and a plurality of second metal portions, a ring-shaped concave portion is formed on a position that is not covered by the first metal portions of the first surface; radii of the conductive channels are r, distances between centers of any two of the conductive channels that are adjacent to each other are L, angles between lines running through centers of any two of the conductive channels that are adjacent to each other within the inner wall of the ring-shaped concave portion and the longitudinal fibers, as well as angles between the lines running through the centers of any two of the conductive channels that are adjacent to each other within the inner wall of the ring-shaped concave portion and the transverse fibers, are all greater than or equal to $\frac{1}{2}(Sin-1(2r/L))$, and distances along fibers between any two of the conductive channels that are adjacent to each other outside the outer wall of the ring-shaped concave portion are all greater than or equal to a shortest distance along the fibers between any two of the conductive channel that are adjacent to each other within the inner wall of the ring-shaped concave portion;
   a ring-shaped magnetic element placed in the ring-shaped concave portion;
   an adhesive layer located on the first surface and covering the first metal portions and the ring-shaped magnetic element;
   a plurality of conductive portions formed on the adhesive layer, and respectively aligned with the second metal portions; and
   a plurality of conductive channels penetrating the conductive portions, the adhesive layer, and the substrate, wherein the conductive channels are respectively located in an inner wall and out of an outer wall of the ring-shaped concave portion, each of the conductive channels comprising a conductive film which electrically connects to the aligned conductive portion and second metal portion.

2. The printed circuit board package structure of claim 1, further comprising:
   a plurality of first protection layers respectively formed in gaps of the conductive channels; and
   two second protection layers, wherein one of the second protection layers is formed on the adhesive layer, the conductive channels, and the conductive portions, and another of the second protection layers is formed on the second metal portions, the conductive channels, and the second surface of the substrate.

3. The printed circuit board package structure of claim 2, wherein the substrate comprises at least two gas channels formed on the outer wall or the inner wall of the ring-shaped concave portion, such that the two gas channels communicates with the ring-shaped concave portion.

4. The printed circuit board package structure of claim 3, wherein a shape of each of the gas channels is semicircular, circular, or a shape easily formed by a route bit along the outer wall or the inner wall of the ring-shaped concave portion.

5. The printed circuit board package structure of claim 3, wherein at least two pressure relief through holes are formed on the adhesive layer and the second protection layers on the adhesive layer, and the two pressure relief through holes are respectively aligned with and communicated with the two gas channels.

6. The printed circuit board package structure of claim 5, wherein bore diameters of the two gas channels are both greater than or equal to bore diameters of the two pressure relief through holes.

7. The printed circuit board package structure of claim 3, wherein depths of the two gas channels are both smaller than or equal to a depth of the ring-shaped concave portion.

8. The printed circuit board package structure of claim 1, further comprising:
   an adhesive material located in the ring-shaped concave portion for fixing the ring-shaped magnetic element.

9. The printed circuit board package structure of claim 1, further comprising:
   a plurality of circuits selectively electrically connecting to any two of the conductive portions or any two of the second metal portions.

10. A printed circuit board package structure comprising:
    a substrate comprising a first surface, and a second surface opposite to the first surface, a plurality of longitudinal fibers, and a plurality of transverse fibers respectively perpendicular to the longitudinal fibers, wherein the first surface and the second surface respectively have a plurality of first metal portions and a plurality of second metal portions, a ring-shaped concave portion is formed on a position that is not covered by the first metal portions of the first surface; when radii of the two adjacent conductive channels is different, a smaller radius of the two adjacent conductive channels is r, a distance between centers of the two adjacent conductive channels is L, angles between lines running through centers of the two adjacent conductive channels within the inner wall of the ring-shaped concave portion and the longitudinal fibers, and angles between the lines running through the centers of the two adjacent conductive channels within the inner wall of the ring-shaped concave portion and the transverse fibers are all greater than or equal to $\frac{1}{2}(Sin-1(2r/L))$, and distances along fibers between any two of the conductive channels that are adjacent to each other outside the outer wall of the ring-shaped concave portion are all greater than or equal to a shortest distance along the fibers between any two of the conductive channels that are adjacent to each other within the inner wall of the ring-shaped concave portion;
    a ring-shaped magnetic element placed in the ring-shaped concave portion;
    an adhesive layer located on the first surface and covering the first metal portions and the ring-shaped magnetic element;

a plurality of conductive portions formed on the adhesive layer, and respectively aligned with the second metal portions; and a plurality of conductive channels penetrating the conductive portions, the adhesive layer, and the substrate, wherein the conductive channels are respectively located in an inner wall and out of an outer wall of the ring-shaped concave portion, each of the conductive channels comprising a conductive film which electrically connects to the aligned conductive portion and second metal portion.

11. The printed circuit board package structure of claim 10, further comprising:

a plurality of first protection layers respectively formed in gaps of the conductive channels; and two second protection layers, wherein one of the second protection layers is formed on the adhesive layer, the conductive channels, and the conductive portions, and another of the second protection layers is formed on the second metal portions, the conductive channels, and the second surface of the substrate.

12. The printed circuit board package structure of claim 11, wherein the substrate comprises at least two gas channels formed on the outer wall or the inner wall of the ring-shaped concave portion, such that the two gas channels communicates with the ring-shaped concave portion.

13. The printed circuit board package structure of claim 12, wherein a shape of each of the gas channels is semicircular, circular, or a shape easily formed by a route bit along the outer wall or the inner wall of the ring-shaped concave portion.

14. The printed circuit board package structure of claim 12, wherein at least two pressure relief through holes are formed on the adhesive layer and the second protection layers on the adhesive layer, and the two pressure relief through holes are respectively aligned with and communicated with the two gas channels.

15. The printed circuit board package structure of claim 14, wherein bore diameters of the two gas channels are both greater than or equal to bore diameters of the two pressure relief through holes.

16. The printed circuit board package structure of claim 12, wherein depths of the two gas channels are both smaller than or equal to a depth of the ring-shaped concave portion.

17. The printed circuit board package structure of claim 10, further comprising:

an adhesive material located in the ring-shaped concave portion for fixing the ring-shaped magnetic element.

18. The printed circuit board package structure of claim 10, further comprising:

a plurality of circuits selectively electrically connecting to any two of the conductive portions or any two of the second metal portions.

* * * * *